(12) United States Patent
Vezier et al.

(10) Patent No.: US 11,764,787 B2
(45) Date of Patent: Sep. 19, 2023

(54) SPATIAL SEGREGATION OF FLEXIBLE LOGIC HARDWARE

(71) Applicant: Silicon Mobility SAS, Valbonne (FR)

(72) Inventors: Loïc Jean Dominique Vezier, La Roquette-sur-Siagne (FR); Anselme Francis Joseph Lebrun, Mougins (FR); Pierre Xavier Dominique Garaccio, La-Colle-sur-Loup (FR)

(73) Assignee: Silicon Mobility SAS, Valbonne (FR)

(*) Notice: Subject to any disclaimer, the term of this patent is extended or adjusted under 35 U.S.C. 154(b) by 135 days.

(21) Appl. No.: 17/608,266

(22) PCT Filed: May 7, 2019

(86) PCT No.: PCT/EP2019/061656
§ 371 (c)(1),
(2) Date: Nov. 2, 2021

(87) PCT Pub. No.: WO2020/224763
PCT Pub. Date: Nov. 12, 2020

(65) Prior Publication Data
US 2022/0294453 A1    Sep. 15, 2022

(51) Int. Cl.
*H03K 19/17756* (2020.01)

(52) U.S. Cl.
CPC .............................. *H03K 19/17756* (2013.01)

(58) Field of Classification Search
None
See application file for complete search history.

(56) References Cited

U.S. PATENT DOCUMENTS

| 6,363,453 | B1* | 3/2002 | Esposito | G06F 11/20 711/2 |
| 7,669,168 | B1 | 2/2010 | Patterson | |
| 10,467,183 | B2* | 11/2019 | Fleming, Jr. | G06F 15/825 |
| 2008/0288909 | A1* | 11/2008 | Leijten-Nowak | G06F 30/34 716/128 |
| 2013/0100750 | A1* | 4/2013 | Ishiguro | H03K 19/1776 365/189.011 |
| 2020/0334081 | A1* | 10/2020 | Vezier | G06F 9/24 |
| 2021/0200540 | A1* | 7/2021 | Chofleming | G06F 9/3001 |

FOREIGN PATENT DOCUMENTS

EP    1713007 A1    10/2006

OTHER PUBLICATIONS

International Search Report and Written Opinion dated Dec. 10, 2019 in reference to co-pending European Patent Application No. PCT/EP2019/061656 filed May 7, 2019.
Liu, et al., "Implementation and optimization of A5-1 algorithm on Coarse-Grained Reconfigurable Cryptographic Logic Array", 2017 IEEE 12th International Conference on Asic (Asicon), IEEE, pp. 279-282, XP033294918, Oct. 25, 2017.

* cited by examiner

*Primary Examiner* — Jany Richardson
(74) *Attorney, Agent, or Firm* — DINSMORE & SHOHL, LLP

(57) ABSTRACT

The invention relates to an electronic system, comprising components and/or units of various kinds, hence the electronic system can be called a heterogeneous system. The invented electronic system can be applied in the electric system digital control domain and in particular it is targeting (but not limited to) control of power train of pure electric or hybrid vehicle electric motors that require hard real time and safe control.

18 Claims, 24 Drawing Sheets

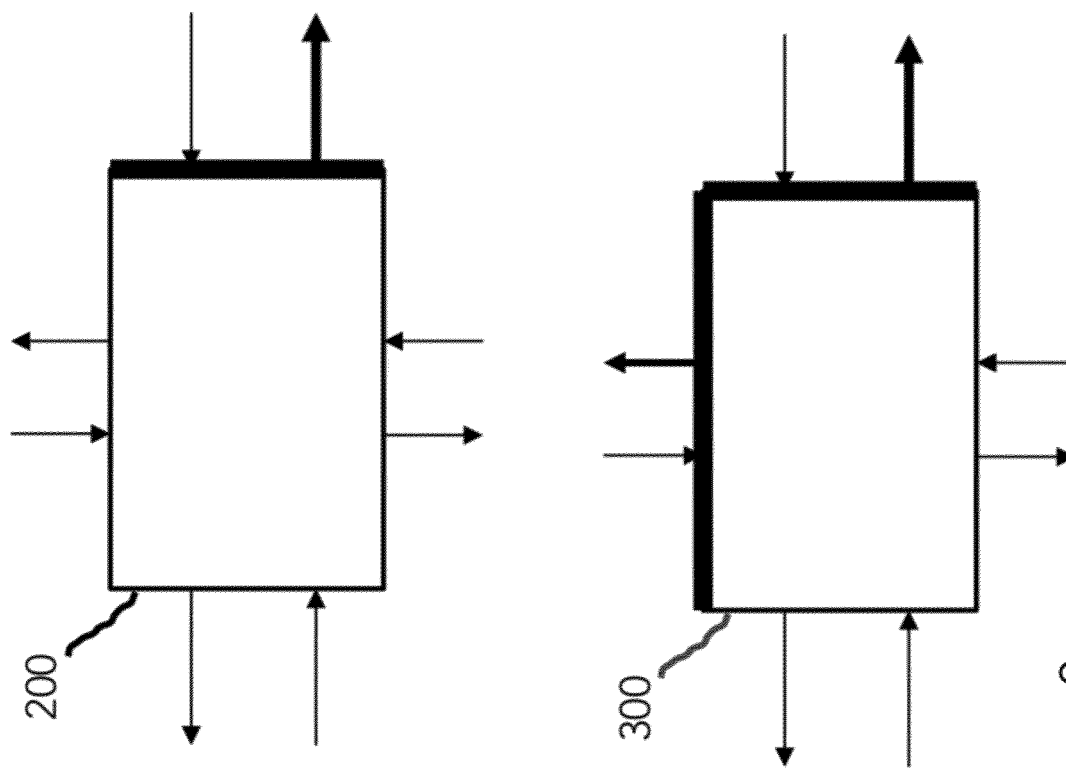
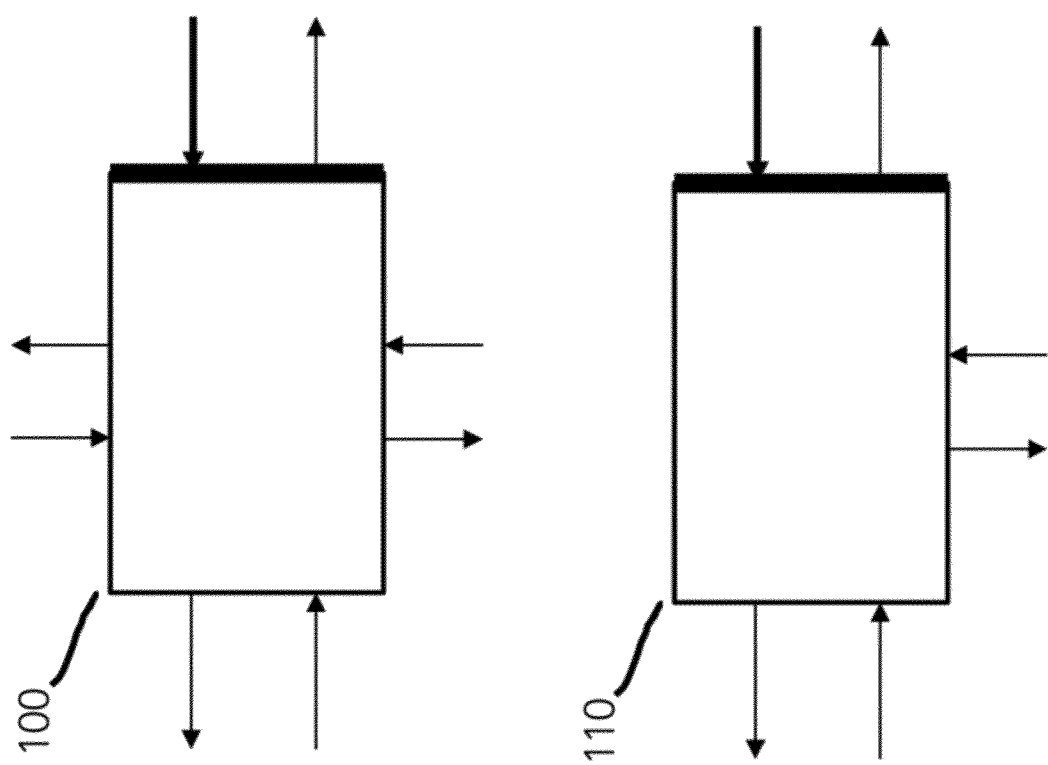
Figure 8

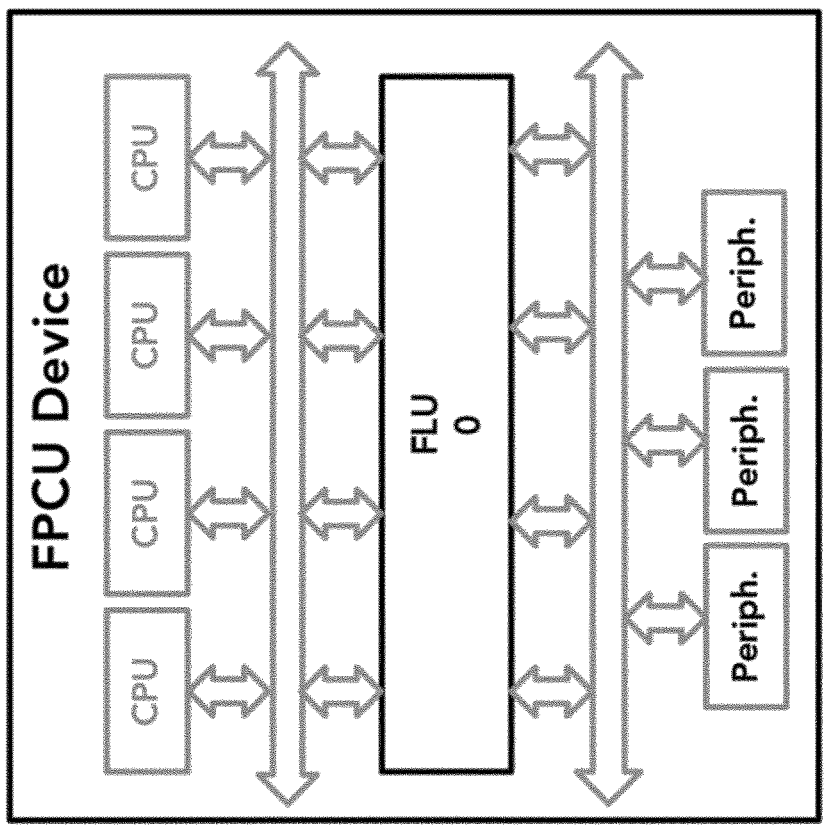
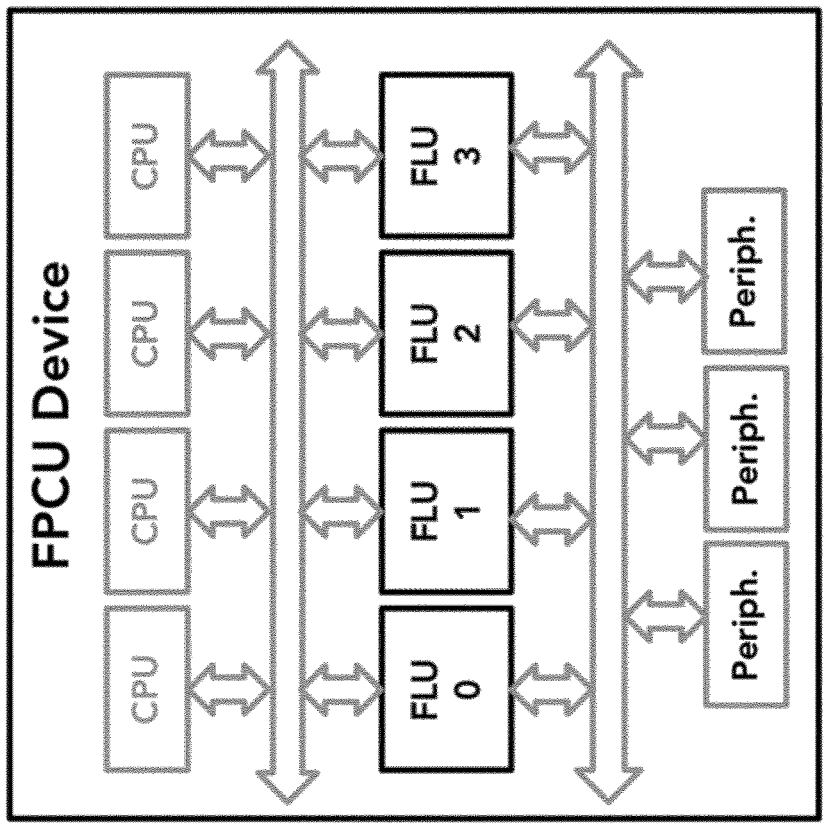
Figure 21

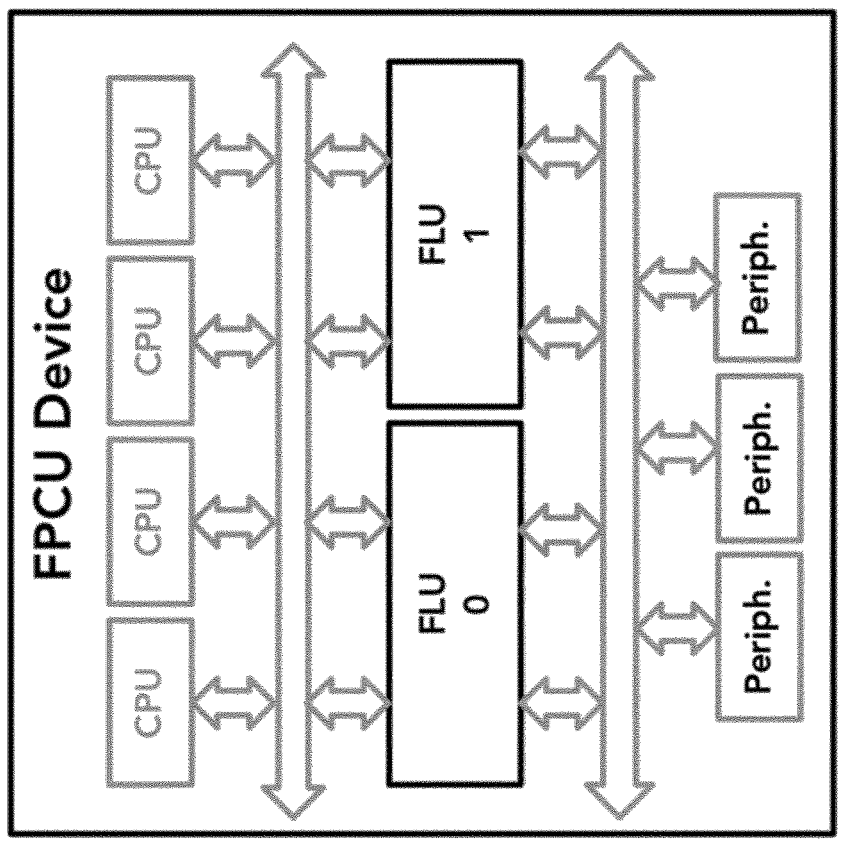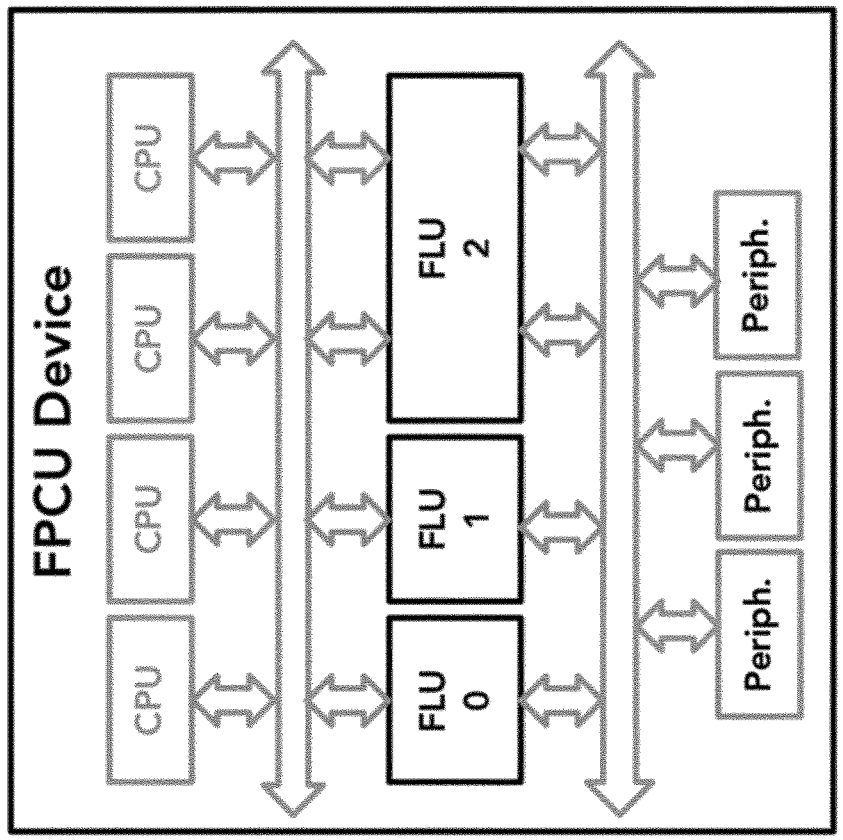
Figure 22

SPATIAL SEGREGATION OF FLEXIBLE LOGIC HARDWARE

CROSS REFERENCES TO RELATED APPLICATIONS

This application is a national-stage application under 35 U.S.C. § 371 of International Application No. PCT/EP2019/061656, filed May 7, 2019.

FIELD OF THE INVENTION

The invention relates to an electronic system, comprising components and/or units of various kinds, hence the electronic system can be called a heterogeneous system. The invented electronic system can be applied in the electric system digital control domain and in particular it is targeting (but not limited to) control of power train of pure electric or hybrid vehicle electric motors that require hard real time and safe control.

BACKGROUND OF THE INVENTION

When using a re-configurable logic (FLU/FPGA) in a context of hard real time and safety sensitive application (like automotive powertrain controller), the following challenges exist:
  In a context of multi-core processing, how can we insure the exclusive allocation of FLU resource to an application?
  In a context of incremental firmware elaboration, how can we insure the non-regression of an already certified firmware?

STATE OF THE ART SOLUTIONS

Single FPGA

As mentioned above, having a single basic eFPGA is a problem because all applications executed in-there are necessarily merged as part of a single FPGA configuration bitstream.

Multiple FPGA's

A simple solution would be to split the matrix in multiple smaller matrices (example with 4 CPU/4 FLU) as illustrated in FIG. 20 (left side).

This solution is obviously OK to enable strict independence of (at most) 4 applications executed in the FPCU. So, demonstrating that the 4 application are independent from each-other is straightforward.

Also, because each application is encoded in a separate FLU bitstream, updating one of them does not require re-compiling the other applications.

However, this architecture suffers of a critical lack of flexibility. Indeed, what if we want to execute only one very complex application. In this case, the FLU part of this application will probably not fit inside one of the parts of FLU. So, the application must be split in 4 hardware pieces. And each piece shall be independently mapped in the 4 FLU parts.

This is technically possible, but practically almost unusable because:
  The different parts of FLU needs to communicate through SOC interconnect which has the following impacts:
  The application performance will be strongly impacted by this data-flow bottleneck.
  The interconnect communication requires the mapping of associated protocol management in each partition. This is a huge waste of FLU resource
  This communication will lead to extra traffic on interconnect that may be critical in terms of real-time constraints.
  No EDA tooling will be intelligent enough to automatically split the logic amongst FLU parts and insert interconnect communication bridges as needed. So the application split must be manually done at design time. This is problem in terms of productivity.

Partial Reconfiguration

Some FPGA vendors provide «partial reconfiguration» of their FPGA matrix. The concept is to be able to map new function on an already mapped FPGA. This technology partially gives an answer to the challenges presented.

However the following problems remain with partial reconfiguration:

It is very difficult to demonstrate the independence of the applications executed in FPGA; even if they have been separately mapped with independent bit-streams. Indeed, the partial reconfiguration is fully handled by tooling and is not necessarily predictable in terms of result. This is not acceptable for safety analysis.

AIM OF THE INVENTION

The invention provides an electronic system with specific dedicated components to enable a particular approach to the above challenges.

SUMMARY OF THE INVENTION

The invention relates to an electronic system, comprising components and/or units of various kinds, hence the electronic system can be called a heterogeneous system, targeting the domain mentioned above.

The invention relates to an electronic system, comprising specific components such as SBOX circuits and/or special control structure, enabling "spatial segregation, wherein separate eFPGA matrices with special boundary "SBOX" elements that allows to "merge" contiguous matrices as if they were a single one from FPGA tooling point of view.

In a first aspect of the invention a system, comprising a plurality of flexile logic unit arrangements (500), arranged side-by-side and adapted for being pair-wise either physically connected or isolated; and a plurality of electronic control structures whereby each electronic control system therein is uniquely associated to one of said flexile logic unit arrangements; and said electronic control structures are adapted for being pair-wise physically connected or disconnected alignment with the connection or isolation of their respective arrangement.

For sake of clarity, the proposed system allows (by providing the necessary supporting structures like control structures) for run-time pair-wise either physically connecting or isolating flexile logic unit arrangements, hence the selection between both is something that is part of the FLU configuration and this is not a choice that is frozen at circuit design time.

In a second aspect of the invention a variety of methods and use-cases enabled by the system of the first aspect, in particular exploiting that said system can be configured in that two or more independent functions are defined by one or more flexible logic units arrangement combined together, each of said functions being independent, these methods comprises acting (such as task or context switching, (partially) reconfiguring, performing safety operations and/or combinations thereof) on said functions defined by their associated (combined) arrangements while keeping the connections (via said circuits) between these associated (combined) arrangements physically isolated.

In a third aspect of the invention a computer program product comprising computer-readable code, that when run on a computer system causes the computer system to execute the methods of any of the previous methods and the related non-transitory machine-readable storage medium storing the computer program products are provided.

BRIEF DESCRIPTION OF THE DRAWINGS

FIG. 8 shows also an abstract representation of alternative SBOX circuits, indicating the isolated sides (bold line). While the top left figure illustrates the input side isolation embodiment, the top right figure illustrates an output side variant thereof. While the non-corner SBOX circuits of FIG. 6, 7 typically have for input-output sides, one may elect for corner SBOX circuit to have less input-output sides are shown in the down left figure. While the various embodiments shown so far have 1 isolated side, figure down right illustrates that also two sides could be provided with isolation functionality.

FIGS. 21 and 22 shows a heterogeneous hardware (FPCU) system comprising: (i) a plurality of electronic components (CPU's, peripherals); and (ii) a hardware programmable unit, being a programmable logic matrix or flexible logic unit (FLU), in accordance with the invention, and the various ways the FLU can be segregated.

DETAILED DESCRIPTION OF THE INVENTION

Challenges

Figure 1:
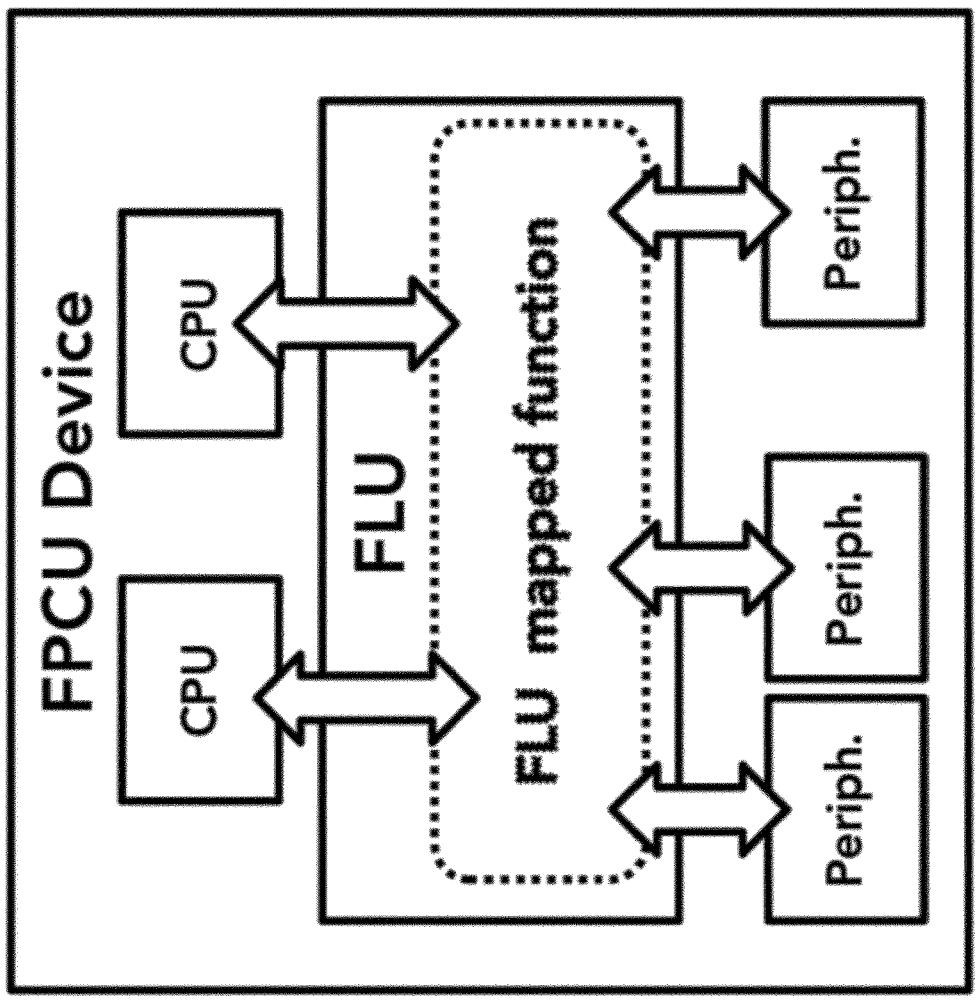
FIG. 1 shows a state of the art heterogeneous hardware (FPCU) system comprising: (i) a plurality of electronic components (CPU's, peripherals); and (ii) a hardware programmable unit, being a programmable logic matrix or flexible logic unit (FLU).
Figure 2:
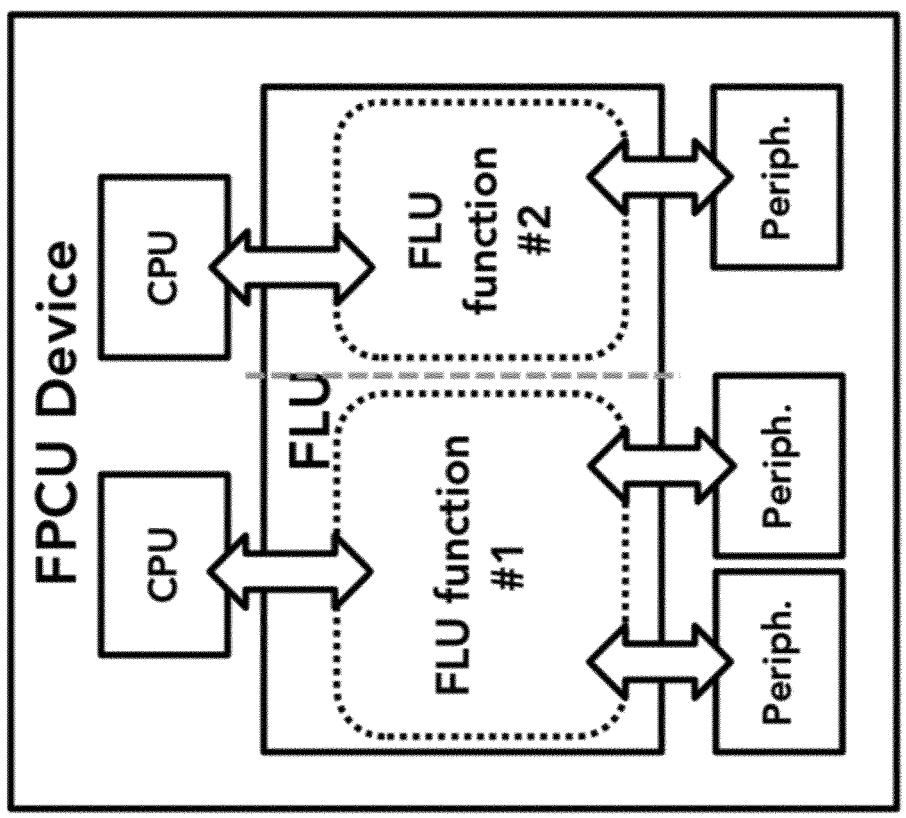
FIG. 2 shows a heterogeneous hardware (FPCU) system comprising: (i) a plurality of electronic components (CPU's, peripherals); and (ii) a hardware programmable unit, being a programmable logic matrix or flexible logic unit (FLU), in accordance with the invention, wherein the FLU is segregated or adapted for being segregated.

Before embarking on an elaborative description of the invented system and its underlying components required, the two challenges solved as addressed in more detail.

Deterministic Multi-Core Processing

The digital control of electric and hybrid vehicle is more and more complex and therefore requires more and more computing power. In addition, there is a trend to try to control multiple systems with one single CPU device.

Example: in an electric vehicle, being able to control both the electric motor(s) and the battery DC/DC converters with the same MCU has valuable benefits in terms of system cost and also in terms of efficiency of the overall system. Indeed, it is possible to share some real-time information between both control algorithms.

Therefore, the MCU processors tend to embed multiple CPU cores in order to execute multiple applications in parallel.

In this kind of system, there is a critical demonstration to be done when application firmware are developed.

Need to demonstrate that real-time constraint of each application is guaranteed whatever the activity of the other applications (hard-real time challenge).

Need to demonstrate that when one application is failing for some reason, then the other applications are not impacted (functional safety challenge)

In a MCU device that uses only pure software control, the following design rules are usually used to guarantee previous challenges:

One application only per CPU core

Exclusive access to critical resources (memories, in particular) Efficient arbitration strategies on SOC interconnect (Quality-of-Service)

Now, let's consider the specific case of an FPCU device that have CPU cores and embedded FPGA matrix (FLU) on the same die. In this context, an "application" is a mix of CPU core executed software and hardware computing executed in FLU. The software part can be managed as explained above. However, for the FLU mapped part of the application, a solution must be defined. Because, by default, all the application executed in FLU are merged in a single bitstream.

Incremental Firmware Certification

This is a functional safety requirement.

Still with a multi-core SOC. Let's imagine the following situation.

A car maker has designed a system that control 2 electric motors and a DC/DC converter using a central CPU device with multi-core that takes care of all the digital processing. This system is stable and fully validated.

Then the car maker feels the need to update the DC/DC control for some reason. Obviously, in this situation the car maker wants to be sure that the motor control algorithms will not be impacted by the change. (meaning: not even the compiled binary code should be modified)

In a pure-software computing (as provided that the car maker used the design rules mentioned in previous section), the procedure is quite simple. The DC/DC application is re-compiled separately and will not influence the other application naturally.

Now, in the case where the CPU is an FPCU, the FLU part of the computing must be handled carefully because all the applications are merged in a single FLU bitstream. So, changing an application necessarily implies re-compiling everything executed in the FLU.

Invented Concept

The "spatial segregation" invention concept is based on separate eFPGA matrices with special boundary "SBOX" elements that allow to "merge" contiguous matrices as if they were a single one from FPGA tooling point of view.

So, on our 4/4 example as illustrated in FIG. 21, various eFPGA configurations can be managed from FPGA synthesis and place-n-route EDA tooling point of view. Doing this, the challenges are fully covered while maintaining maximal eFPGA resources usage flexibility without any design time or hardware usage overhead.

The invented concept is now further described.

Figure 14:
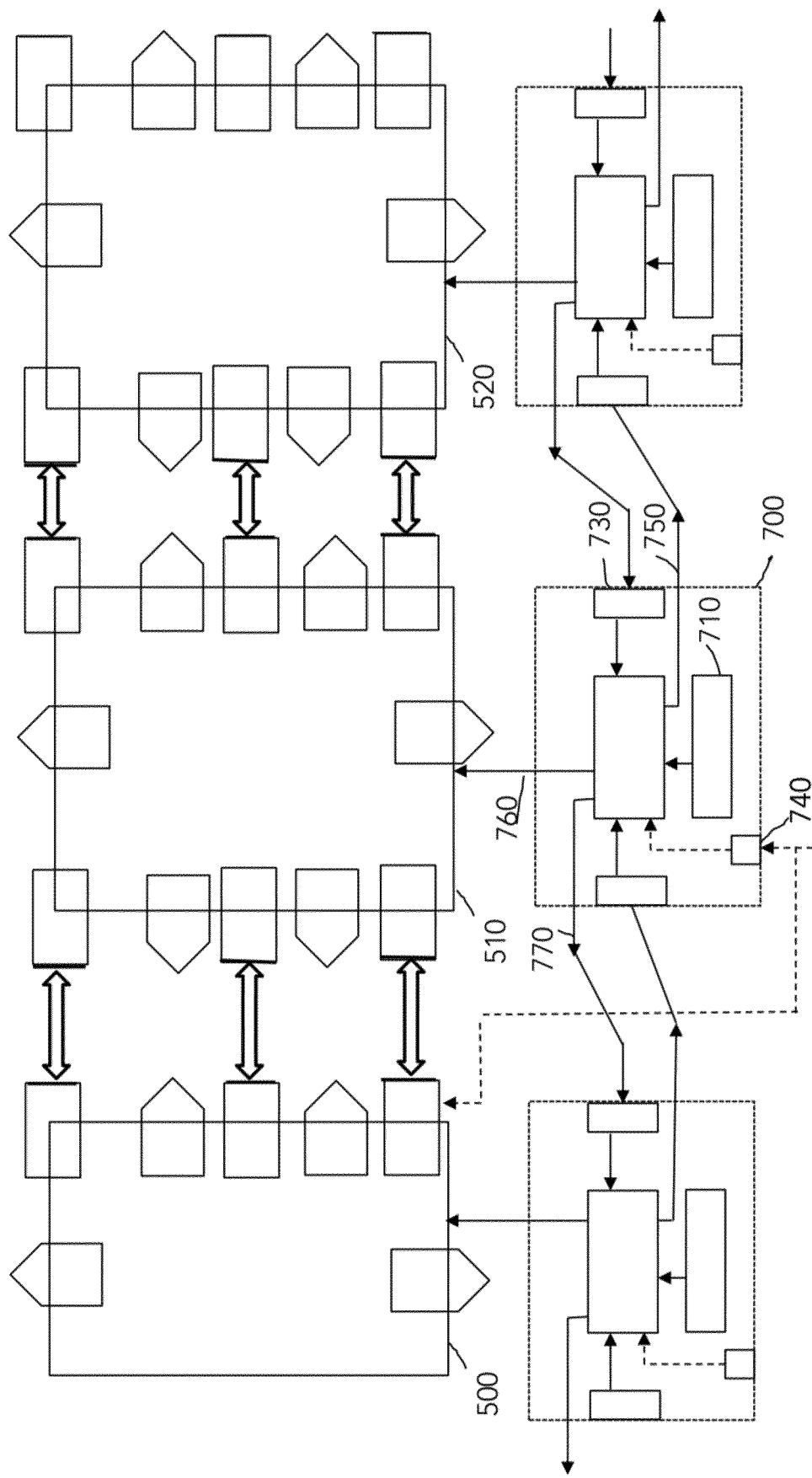
FIG. 14 shows an abstract representation of a flexible logic unit system comprising a plurality of (FLU) (unit) arrangements, here arranged side-by-side and adapted for being each pair-wise (and hence extendible along the row) either physically connected or isolated; and a plurality of (electronic) control structures whereby each control system therein is (uniquely) associated to one of said (FLU) (unit) arrangements; and said (electronic) control structures are (like wise) each pair-wise (and hence extendible along the row) connected or connectable, more in particular said (electronic) control structure (connectable to control structures of the same kind), comprising: the typical control system for (capable of) generating instructions or signals for control of a (FLU) (unit) arrangement and logic around it.

As shown in FIG. 14, the invention relates to a (FLU) system (400), comprising a plurality of (FLU) (unit) arrangements (500, 510), arranged side-by-side and adapted for being pair-wise either physically connected or isolated (in accordance with configuration information) (and extendible along a row, column or both); and a plurality of (electronic) control structures (receiving said configuration information) whereby each control system therein is (uniquely) associated to one of said (FLU) (unit) arrangements; and said (electronic) control structures are adapted for being pair-wise connected or disconnected (in accordance with said configuration information).

Indeed in a FPCU device, a FLU matrix is necessarily associated to a FLU controller responsible for:

FLU matrix clock/reset generation

FLU matrix bitstream loading

FLU matrix context switch sequence control

. . . .

Those sequences are based on dedicated signals going back and forth between FLU matrix and FLU control. In our segregated architecture in accordance with the invention, each FLU partition is necessarily associated to one controller. This is OK when all partitions are isolated with each other.

However, when two or more partitions are joint together, then some synchronization must be insured between involved FLU controllers:

All clock and reset of joint FLU partitions must be simultaneous

Context switch sequence of joint FLU partitions must be simultaneous

. . . .

So there must be a mean to insure this synchronization.

Our solution is based on the concept of "master FLU controller" where one of the FLU controller in a groups of "merged" FLU partitions has a mastership role for the actions listed above.

Figure 20:
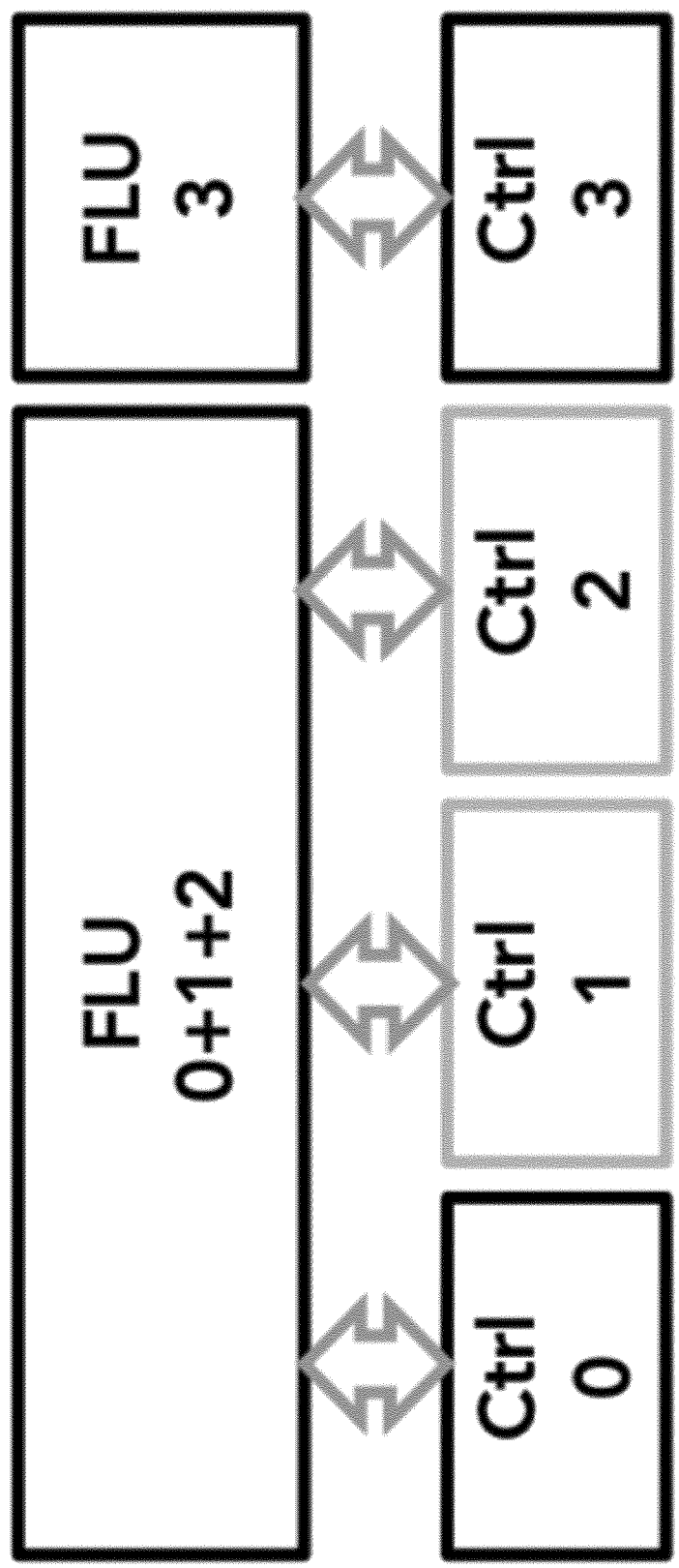
FIG. 20 shows an abstract of the FLU (unit) arrangements and their control structures.

The example of FIG. 20 explains the concept of master FLU controller. In this example:
Controller 0 is master of FLU group 0+1+2
Controller 1 and 2 are slaves for this group
Controller 3 is master of group 3

In previous example, the clock and reset of FLU matrices 0/1/2 must be generated at the same time by all controllers.

Figure 15:
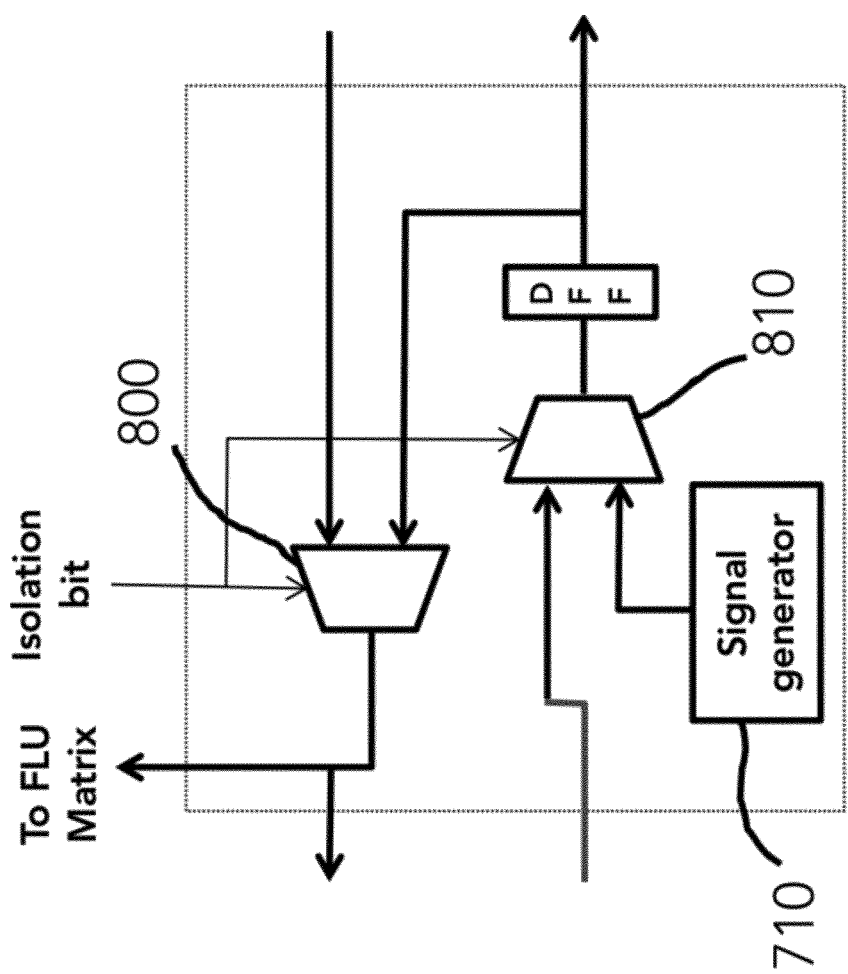
FIG. 15 shows an embodiment of such (electronic) control structures with the typical control system or signal generation and the logic around it, here comprising of selectors (multiplexers) and storage means (D-flip flop).
Figure 17:
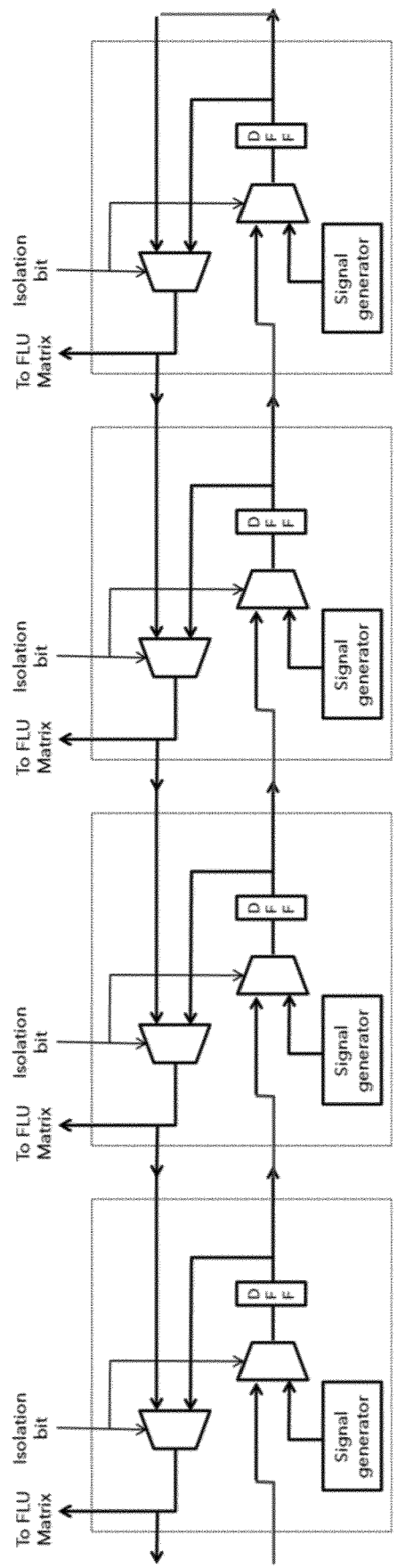
FIG. 17 shows how such (electronic) control structures are connected and the circuit realization thereof.
Figure 18:
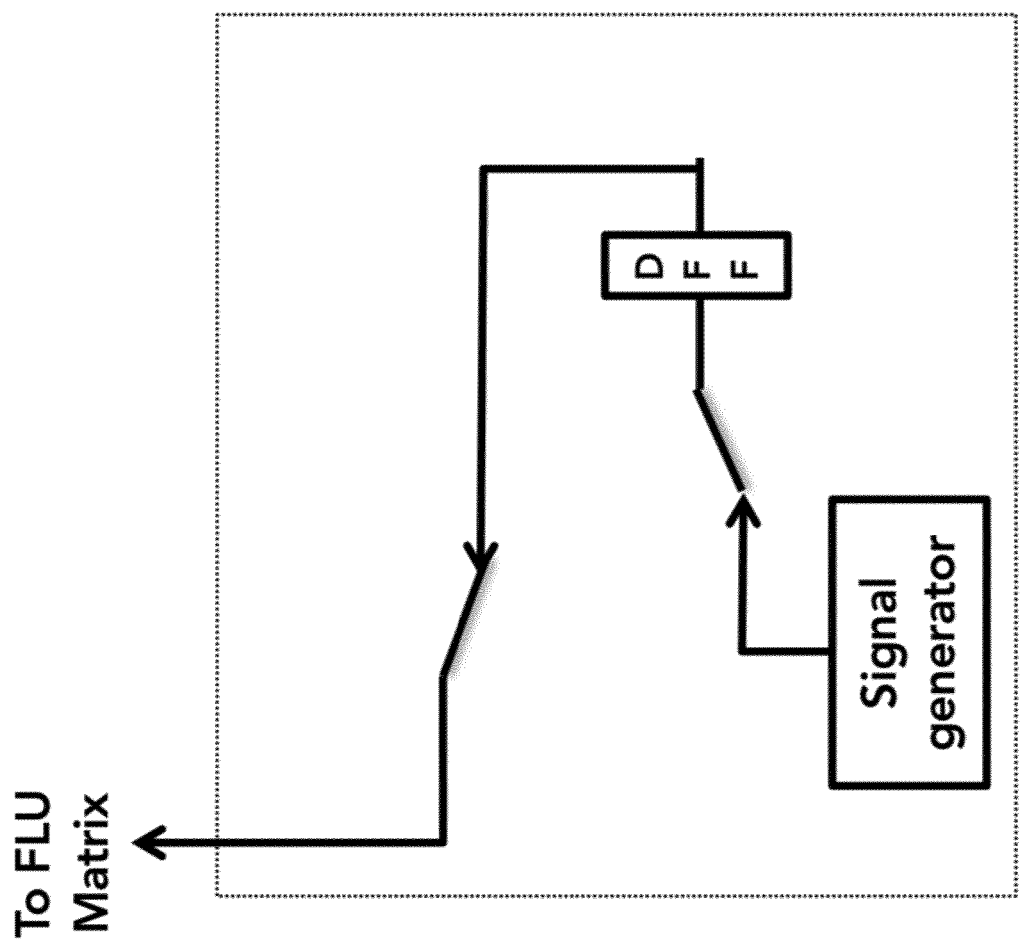
FIG. 18 shows an unconnected (electronic) control structure and how the control flow then gets organized.

To enable this, a daisy chain is constructed between all "contiguous" controllers based on the basic structure within on controller described in FIG. 15. All controllers are connected side-by-side as shown in FIG. 17.

Therefore, if a FLU partition is joint with his leftmost FLU partition, then both corresponding controllers are chained and the leftmost becomes the master of the group.

Figure 16:
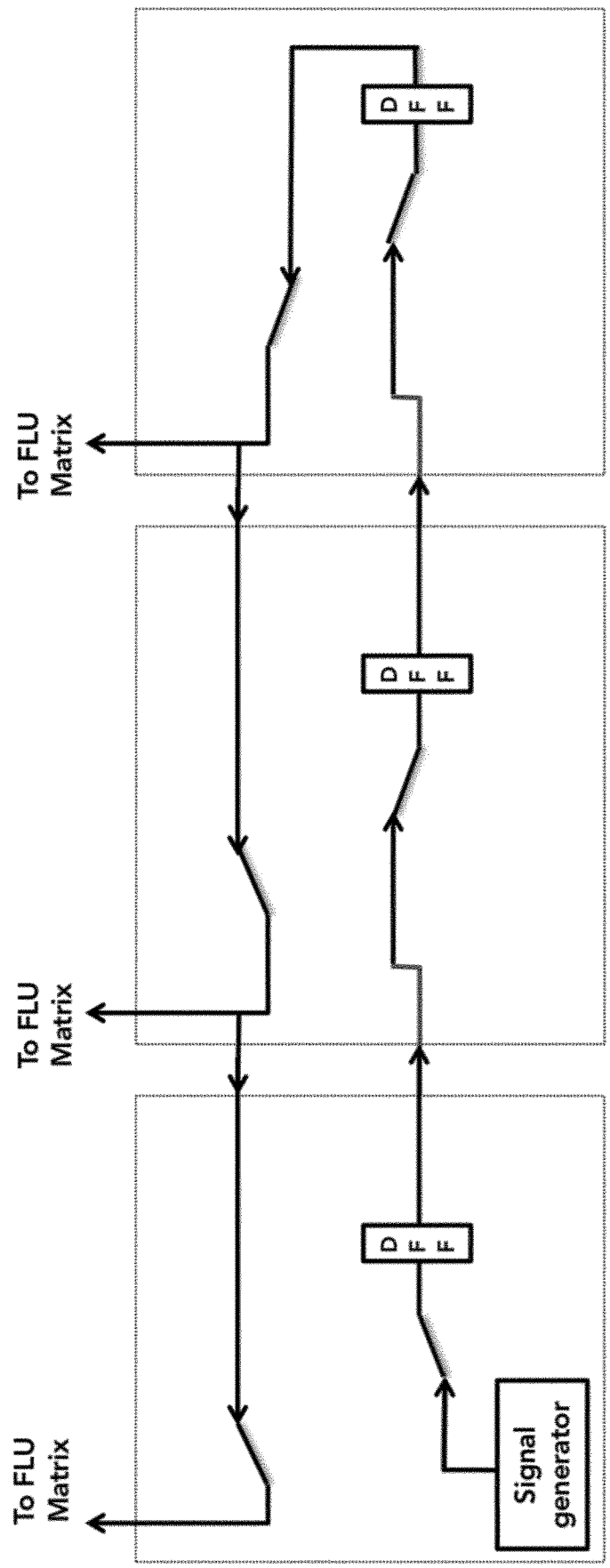
FIG. 16 shows how such (electronic) control structures are connected and how for a certain configuration the control flow get organized by this connection.

For our example, the controller chains would look like in FIG. 16.

Notes:
The "forward" chain on bottom of the drawing is design to propagate the signal from master to right-most controller. There can be zero or multiple flip-flops on this path. This is not important in terms of function (just a latency delay inserted). However, having the possibility to put flops is important in terms of timing closure of the design (avoid too long path)

The backward path propagates back the signal to the master. On this path we cannot have any flop to guarantee synchronous behaviour of signals to all FLU matrices in the group.

Generally speaking within such (FLU) system (400) these said (electronic) control structure (700) (connectable to control structures of the same kind), are comprising: a control system (710) for (capable of) generating control signals (instructions or signals (such as clock, reset or context switch signals)) for control of a (FLU) (unit) arrangement (500, 510); first control signal input means (720) for receiving first control signals from a first (external) control system (possibly being part of an other similar (electronic) control structure); second control input means (730) for receiving second control signals (possibly from yet another similar (electronic) control structure); configuration input means (740) for inputting information (configuration bit) representative to whether (neighbouring) arrangements are physically connected or isolated; control logic, capable on the basis of said information, to select either control signals (the instructions or signals) generated by said control system as output (760) (towards its associated (FLU) (unit) arrangement) or otherwise both pass said first control signals through (750) to said yet another control structure (optionally with delay), use said second control signals as output (towards its associated (FLU) (unit) arrangement) and pass through (770) said second control signals to said other control structure.

An exemplary embodiment of such control structure is shown in FIG. 17, showing that the (electronic) control structure control logic comprises (two) selectors (800, 810), preferably multiplexers (controlled by said information, being for instance said configuration bit). The electronic control structure control logic comprises a storage means (820), preferably a (D–) flipflop in the pass through path.

Figure 9:
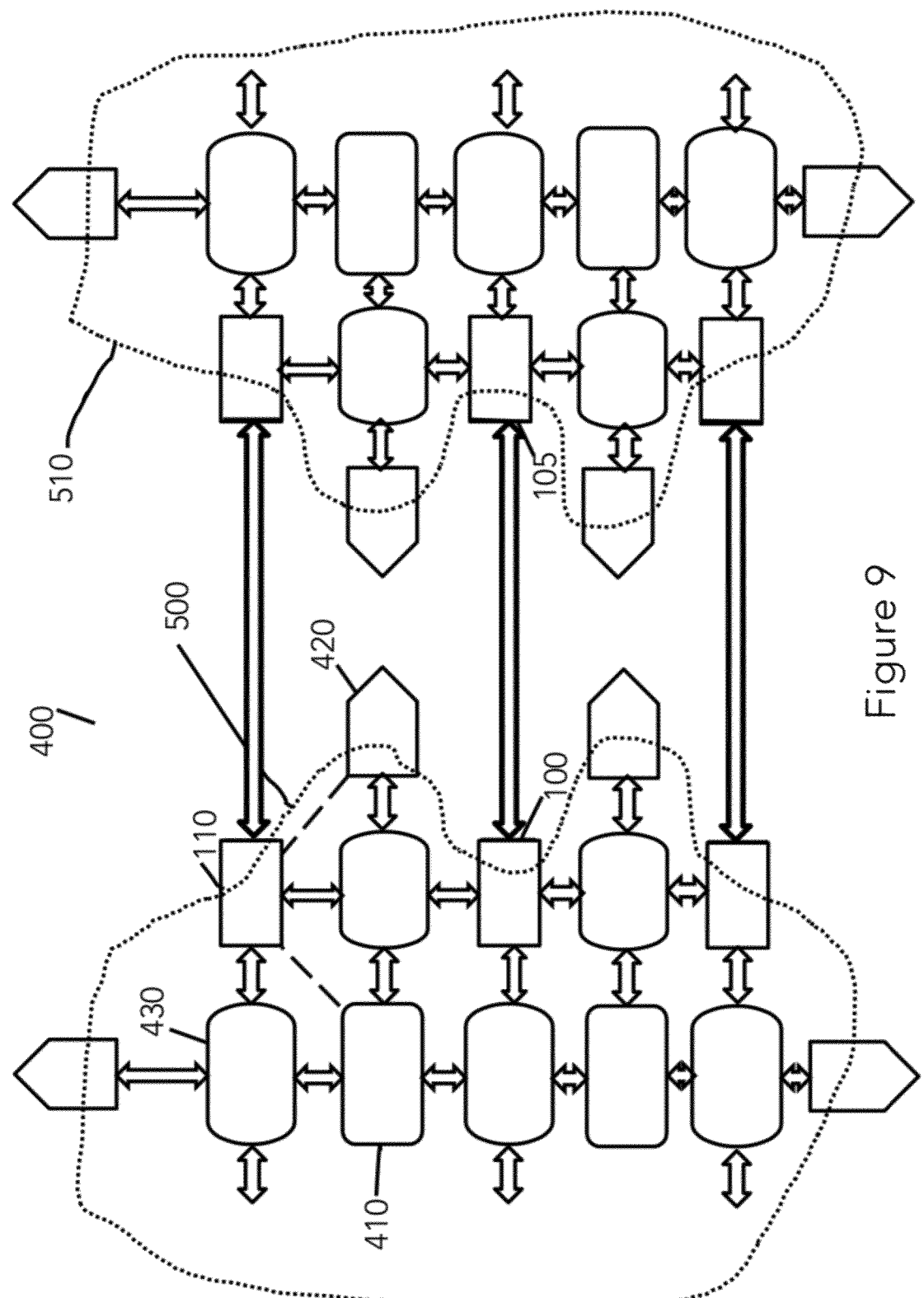
FIG. 9 shows a flexible logic unit system comprising a plurality of flexible logic unit (unit) arrangements, each arrangement comprising a plurality of computational blocks, arranged in (a 2D array) side by side; a plurality of input-output blocks (IOB's), provided at the boundaries of said arrangement; and a plurality of connection blocks (CB's), each of said (FLU) (unit) arrangements further comprises a plurality of (SBOX) (blocks) circuits (also) provided at the boundaries of said arrangements and connectable to said computational blocks, said input-output blocks of the same arrangement; and indirectly connectable with each other within the same arrangement (via said connection blocks (CB's)) or directly when belonging to another arrangement.
Figure 10:
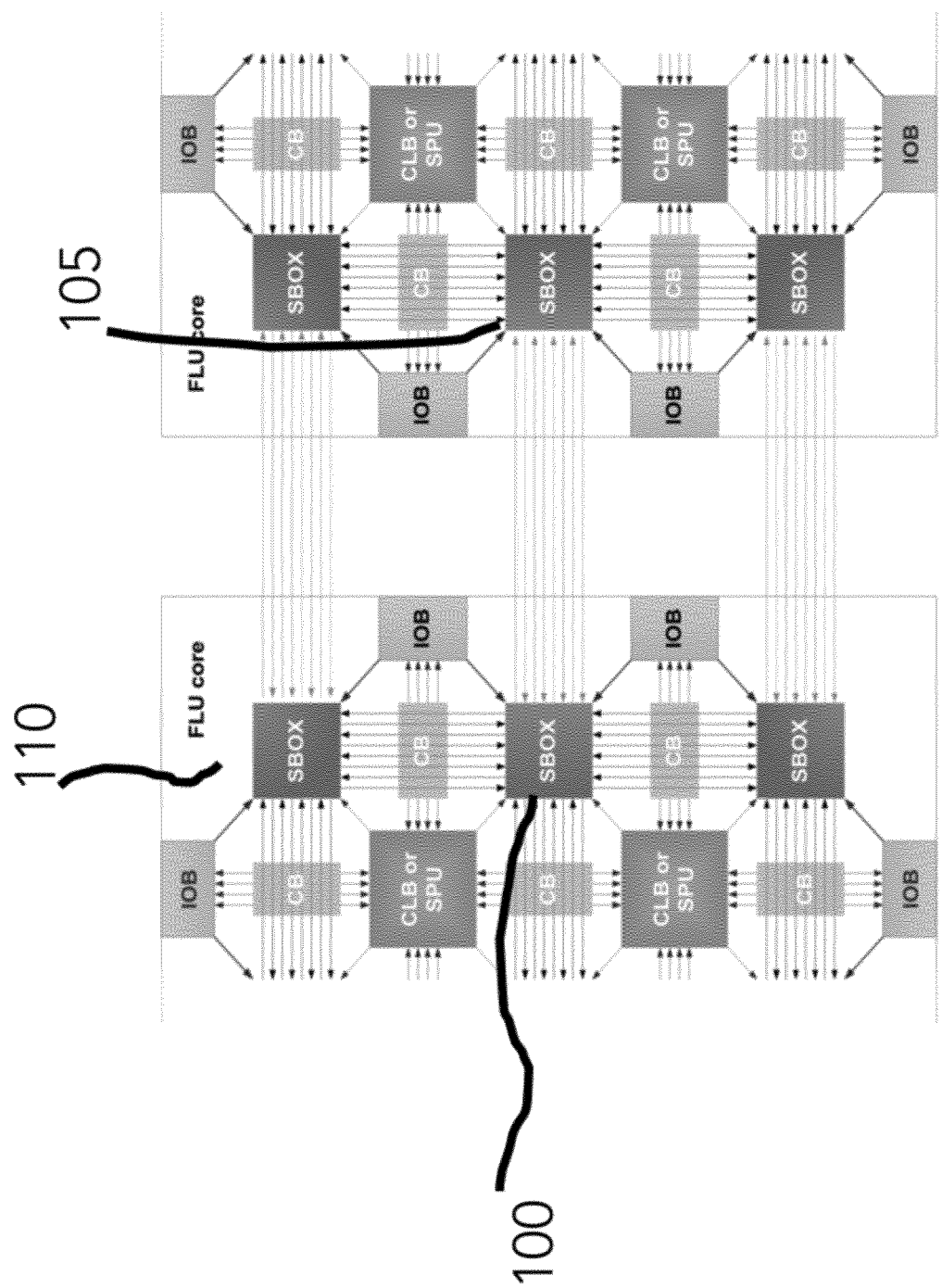
FIG. 10 shows an embodiment of the system of the previous figure, indicating a possible interconnecting scheme.
Figure 11:
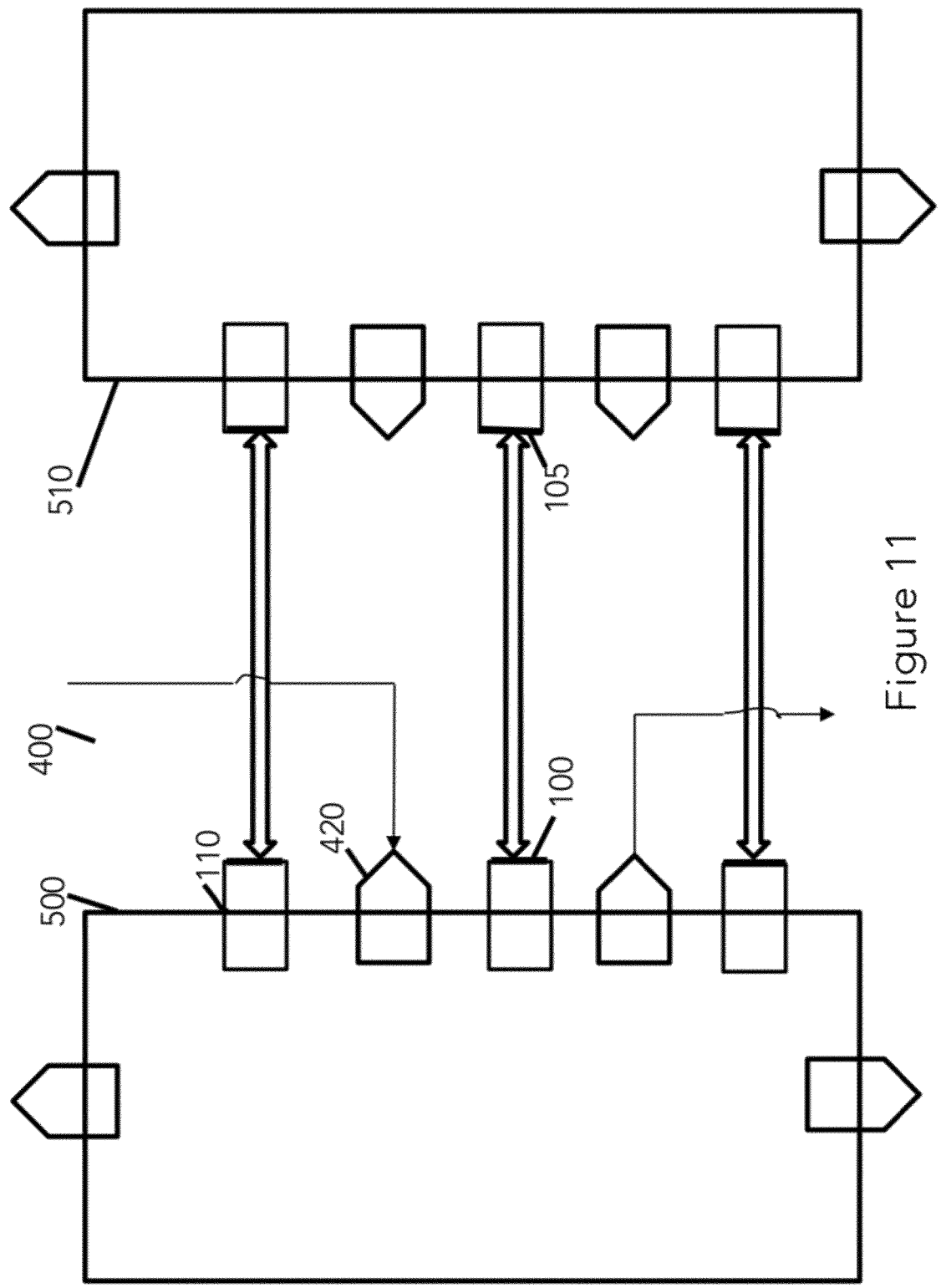
FIG. 11 shows an abstract representation of such flexible logic unit system comprising a plurality of flexible logic unit (unit) arrangements (arranged in 1 row), each having a plurality of input-output blocks (IOB's), provided at the boundaries of said arrangement, for providing input or output functionality outside the flexible logic unit (arrangement) while each of said flexible logic unit (unit) arrangements further comprises a plurality of (SBOX) (blocks) circuits (also) provided at the boundaries of said arrangements, providing input and/or output functionality inside the flexible logic unit and hence being connectable with each other directly when belonging to another arrangement.
Figure 12:
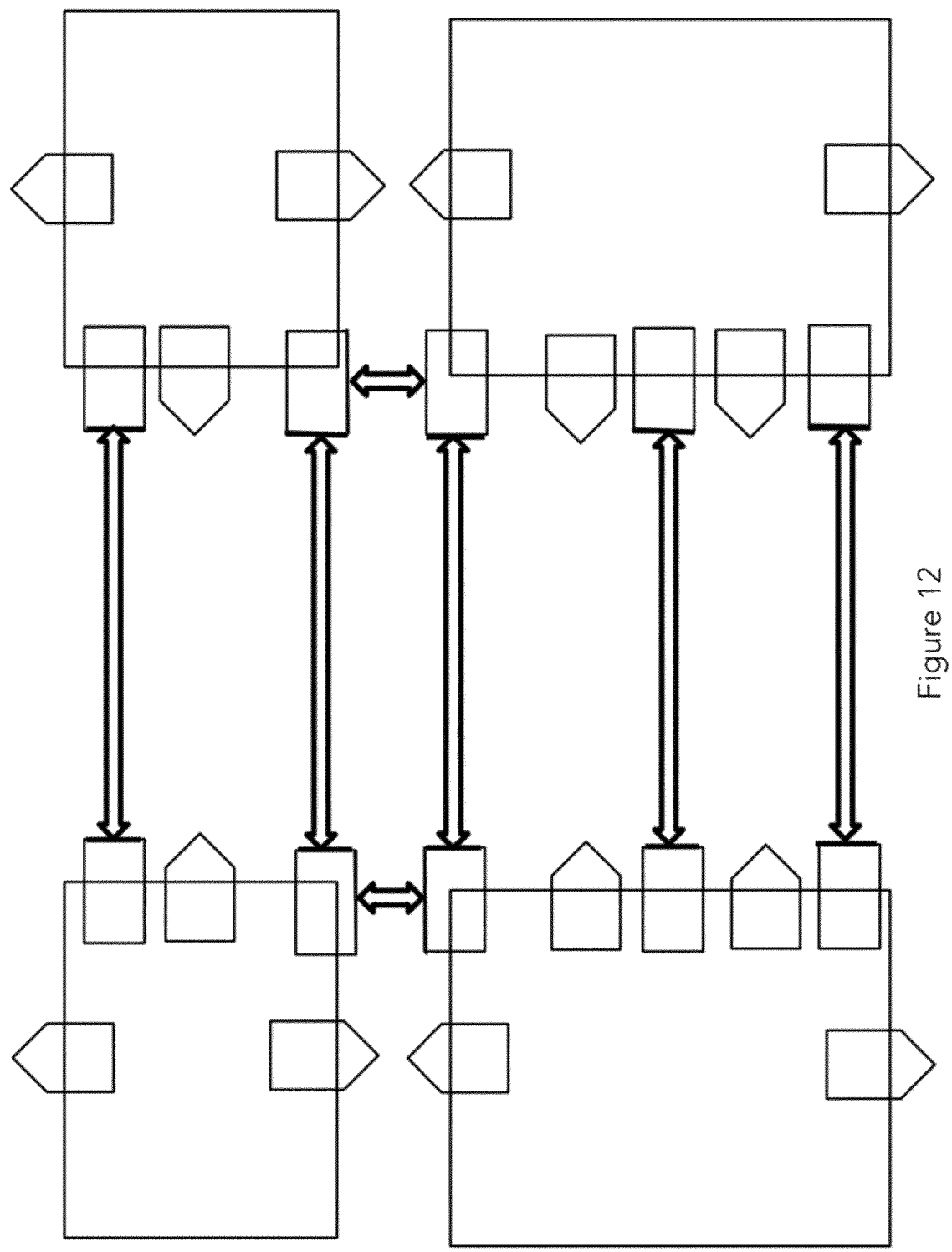
FIG. 12 shows an abstract representation of such flexible logic unit system comprising a plurality of flexible logic unit (unit) arrangements, arranged in a 2D fashion, and isolatable connectable hence in 2 dimensions.
Figure 13:
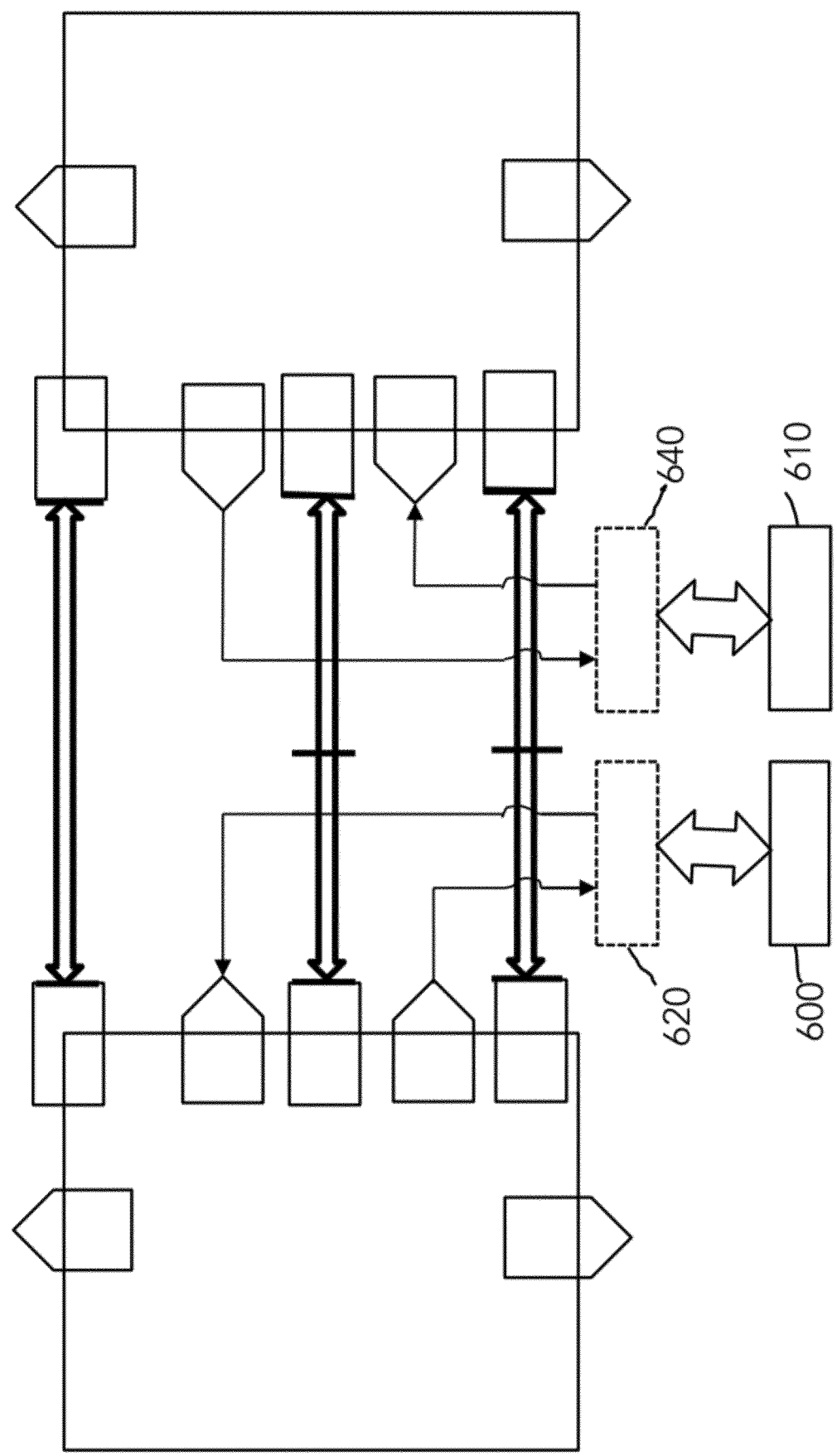
FIG. 13 shows an abstract representation of a system being a heterogeneous hardware system comprising: (i) a plurality of electronic components; and (ii) a hardware programmable unit, being a programmable logic matrix or flexible logic unit as described before, whereby a first combined arrangement is connected (via its input-output blocks) to a first electronic component; and a second combined arrangement being connected (via its input-output blocks) to a second electronic component (said connection may be direct or indirect via additional (slave) interface circuits, preferably one per arrangement).

As shown in FIG. 9, the invention comprises a (FLU) system (400), comprising a plurality of (FLU) (unit) arrangements (500, 510), each arrangement comprising a plurality of computational blocks (410) (configurable logic blocks (CLB's) and/or signal processing units (SPU's), arranged in (a 2D array) side by side); a plurality of input-output blocks (IOB's)(420), provided at the boundaries of said arrangement; (and a plurality of connection blocks (CB's) (430)), each of said (FLU) (unit) arrangements further comprises a plurality of (SBOX) (blocks) circuits (100, 105, 110) (also) provided at the boundaries of said arrangements and connectable to said computational blocks, said input-output blocks (either directly or indirectly via said connection blocks (CB's)) of the same arrangement; and indirectly connectable with each other within the same arrangement (via said connection blocks (CB's)) or directly when belonging to another arrangement. Preferably the above is supplemented with the controller aspect of the invention discussed above.

It is worth noting that in essence the IOB's are provided for ensuring communication (input, output) outside the FLU while the (SBOX) circuit are provided for communication inside the FLU, to enable acting as a bigger matrix (although they are not necessarily limited thereto).

It is also worth emphasizing at this stage that with a (FLU) (unit) arrangements (500, 510) is meant being capable of acting independent, autonomous and hence being capable of being programmed or configured with its own bitstream.

Figure 6:
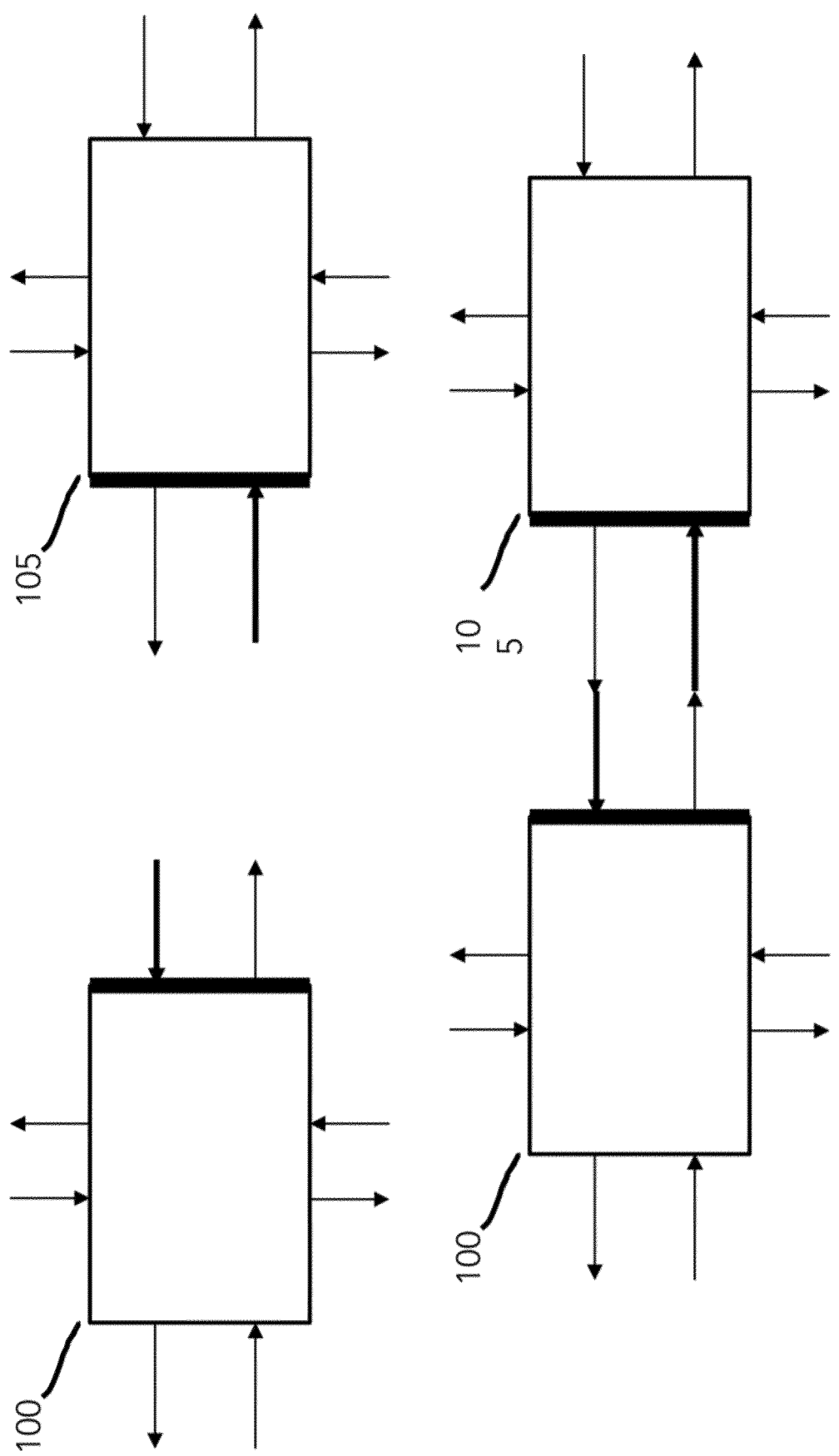
FIG. 6 shows an abstract representation of typically non-corner SBOX circuits, indicating the isolated sides (bold line) and indicating that the input is capable of being isolated (bold line) and a manner of combining such SBOX circuits.
Figure 7:
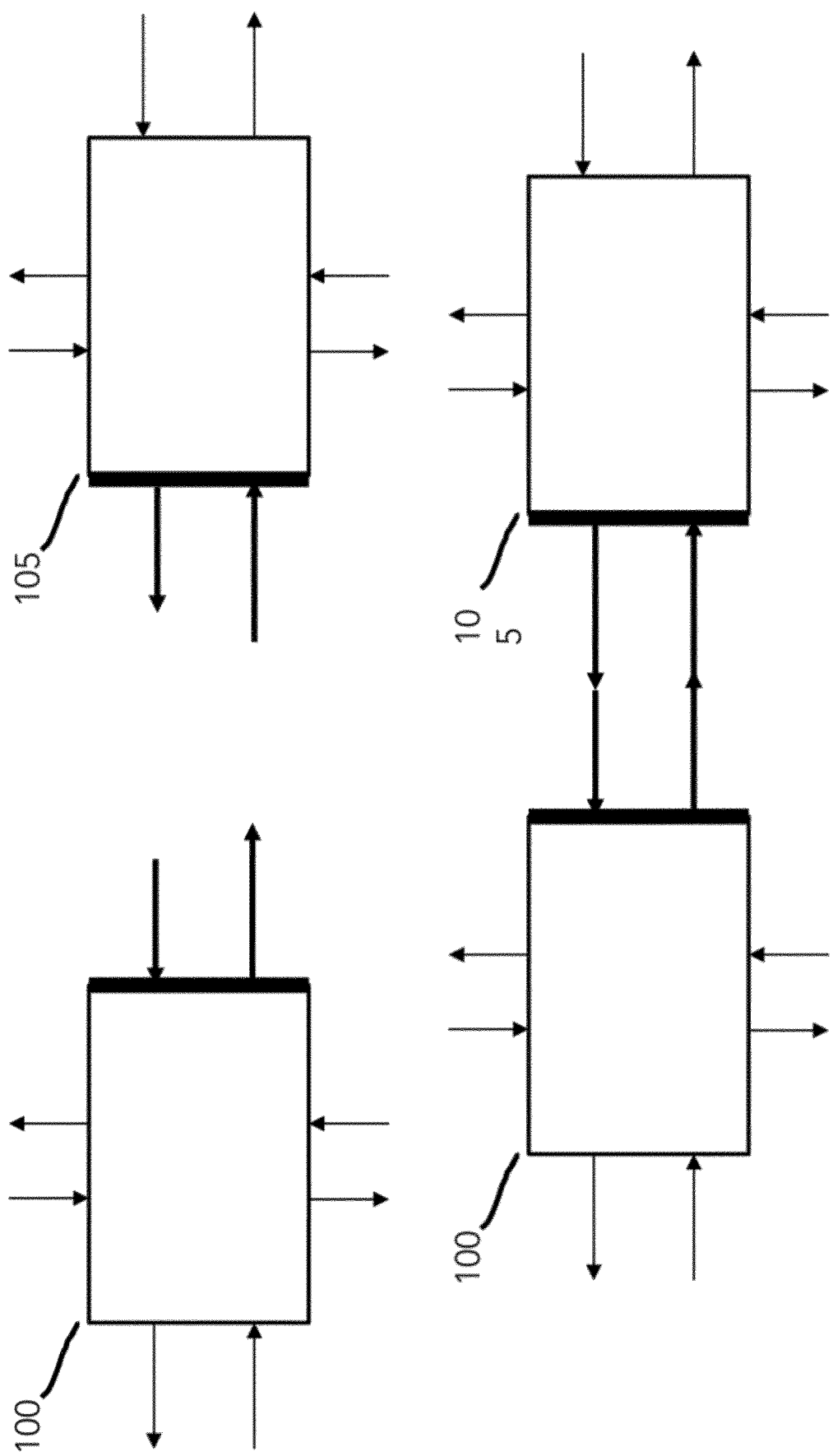
FIG. 7 shows also an abstract representation of typically non-corner SBOX circuits, indicating the isolated sides (bold line) and indicating that both input and output are capable of being isolated (bold line) and a manner of combining such SBOX circuits.

Generally speaking said (SBOX) circuits (belonging to a different arrangement) are connected directly only via at least one of said physically isolatable inputs or output(s), and optionally via two of said physically isolatable outputs or inputs respectively. As shown in FIG. 6, the only necessary condition is that along a connection of two of those circuits there is one isolation possibility. As shown in FIG. 7, alternatives wherein two isolation possibilities are foreseen are also possible, providing extra security.

In the exemplary embodiment of FIG. 9, one further observes the plurality of connection blocks (CB's) (430) arranged between said computational blocks or input-output blocks, to connect neighbouring computational blocks of the same arrangement at least with each other or with an of input-output block of the same arrangement.

Alternative formulated the invention provides a (FLU) system (400), comprising a plurality of computational blocks (410) (configurable logic blocks (CLB's) and/or signal processing units (SPU's), arranged in a (2D array) side by side; a plurality of input-output blocks (IOB's)(420); (and a plurality of connection blocks (CB's) (430)), the system further comprises a plurality of (SBOX) (blocks) circuits (100, 105, 110) connectable to said computational blocks, said input-output blocks (via said connection blocks (CB's)); and indirectly connectable with each other (via said connection blocks (CB's)) or directly.

More generally speaking as such (FLU) systems comprises of many blocks, defining an internal routing logic, one can define, that to ensure the segregation functionality provided by the invention, that the (SBOX) circuits are provided as part of such internal routing logic.

Figure 3:
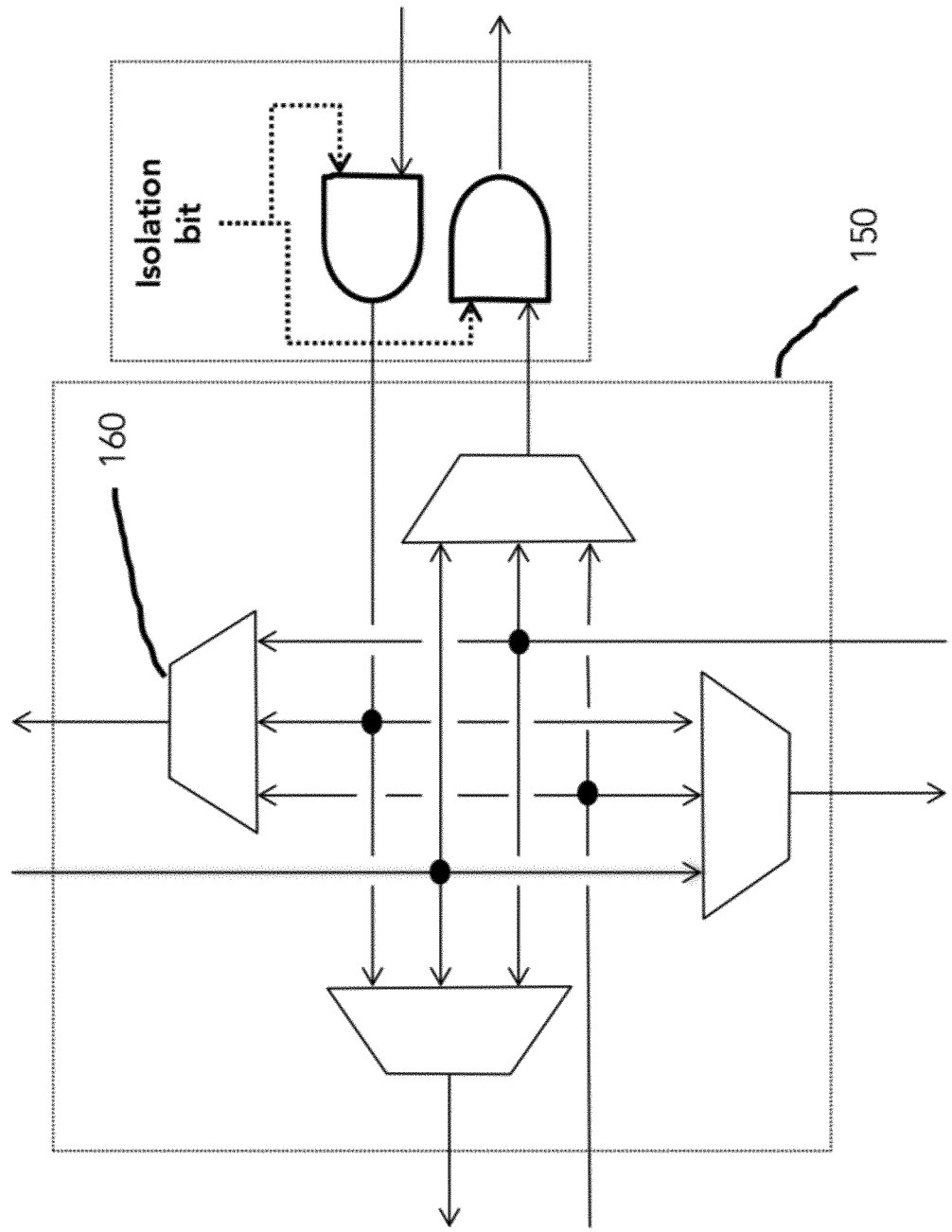
FIG. 3 shows an exemplary embodiment of a SBOX circuit, required in the invention, with its signal routing logic, comprising a selector (multiplexer) using a single isolation bit.
Figure 4:
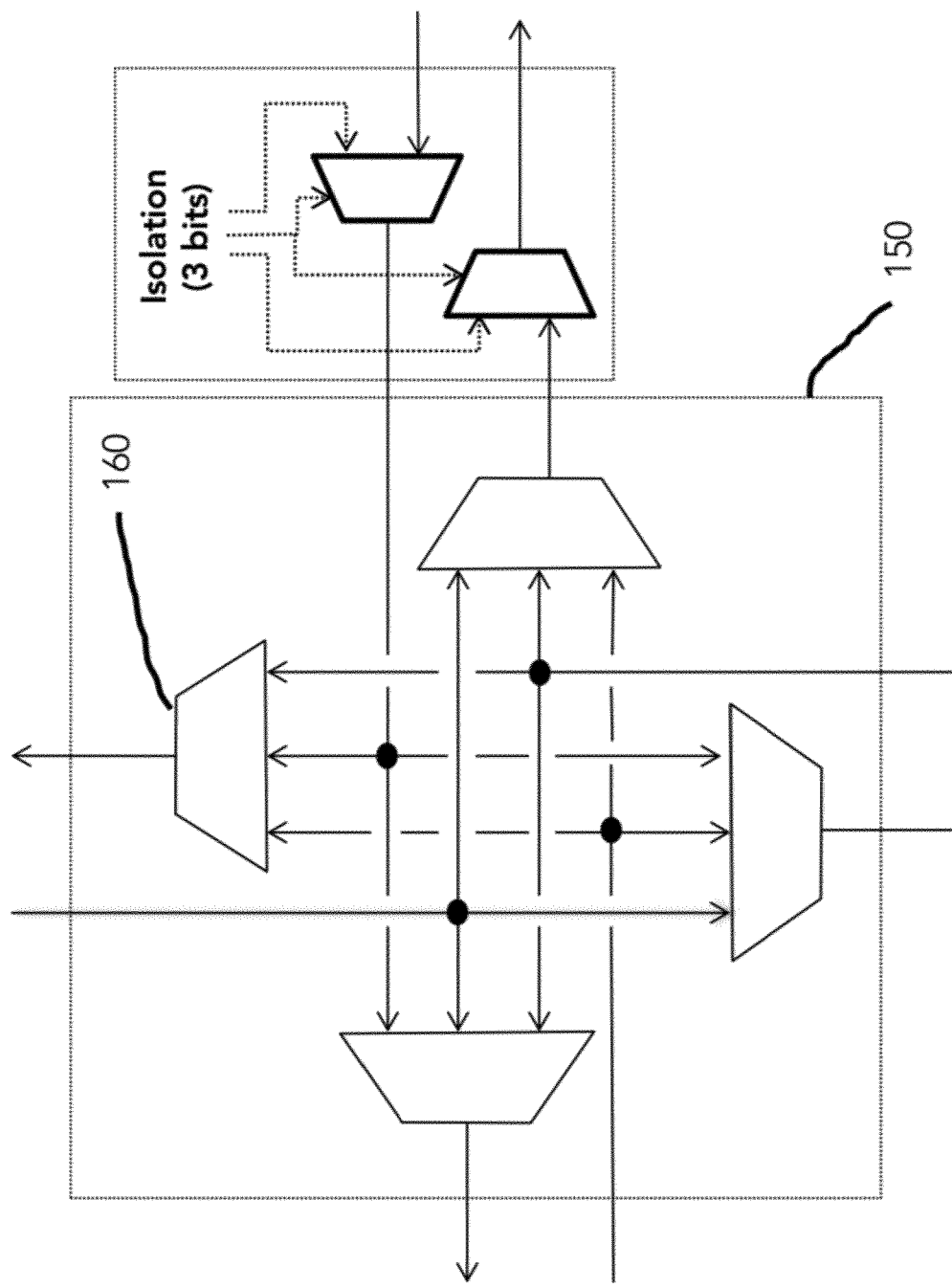
FIG. 4 shows an alternative exemplary embodiment of a SBOX circuit, required in the invention, with its signal routing logic, comprising a selector (multiplexer) using three isolation bits.

Recall that a FLU matrix structure is basically a tile of logic functions (LUT, SPU, RAM . . . ) interleaved with switch boxes interconnected together on a network of routing channels. The switch boxes (SBOX) consists of a set of multiplexer that route the channels signals according to the FPGA configuration information loaded from application bitstream. The basic structure of an SBOX as a described in FIG. 3 the portion (150) (showing only one channel). The spatial segregation concept is based on a modification of this standard SBOX. On one side of this component, a specific logic is added to provide "isolation" capabilities.

The isolation logic is responsible for:
1. (Mandatory): setting each input of the given side to a constant value.
2. (Optional): Setting each output of the given side to a constant value.

The isolation mechanism is controlled by a specific configuration bit that is part of the configuration bitstream of the considered FLU part.

The drawings 3 and 4 give some example of possible isolation means.

The invention hence provides the following (SBOX) circuit (100, 110, 200, 300) with at least 3 IO (input-output) sides (each with at least one input and one output), the circuit being arranged for directing (selectively) each of said inputs (individually) to two or more of said outputs, the circuit being characterized in that the access to either the inputs and/or output(s) at one or multiple sides are physically isolatable, and optionally the inputs and/or output(s) are settable at a predefined value. Moreover the invention provides a non-corner (SBOX) circuit with 4 IO sides.

The SBOX circuits have a means (120) for physical isolating said output or input.

Two exemplary embodiments are provided here.

In the first embodiment said means (for physical isolating said output or input) is comprising a (configuration bit) storage means (130) and an isolation means (140) (such as a logical AND gate) (actually at least one such storage means and isolation means for either input or for the output and possible one for both).

In a second alternative embodiment said means (for physical isolating said output or input) is comprising a (configuration bit) storage means (130) and a selector (preferably a multiplexer) both using said configuration bit as input and a selector control (actually at least one selector for either input or for the output and possible one for both).

The SBOX circuit do have signal routing logic (150), for instance using multiplexers (160).

Figure 5:
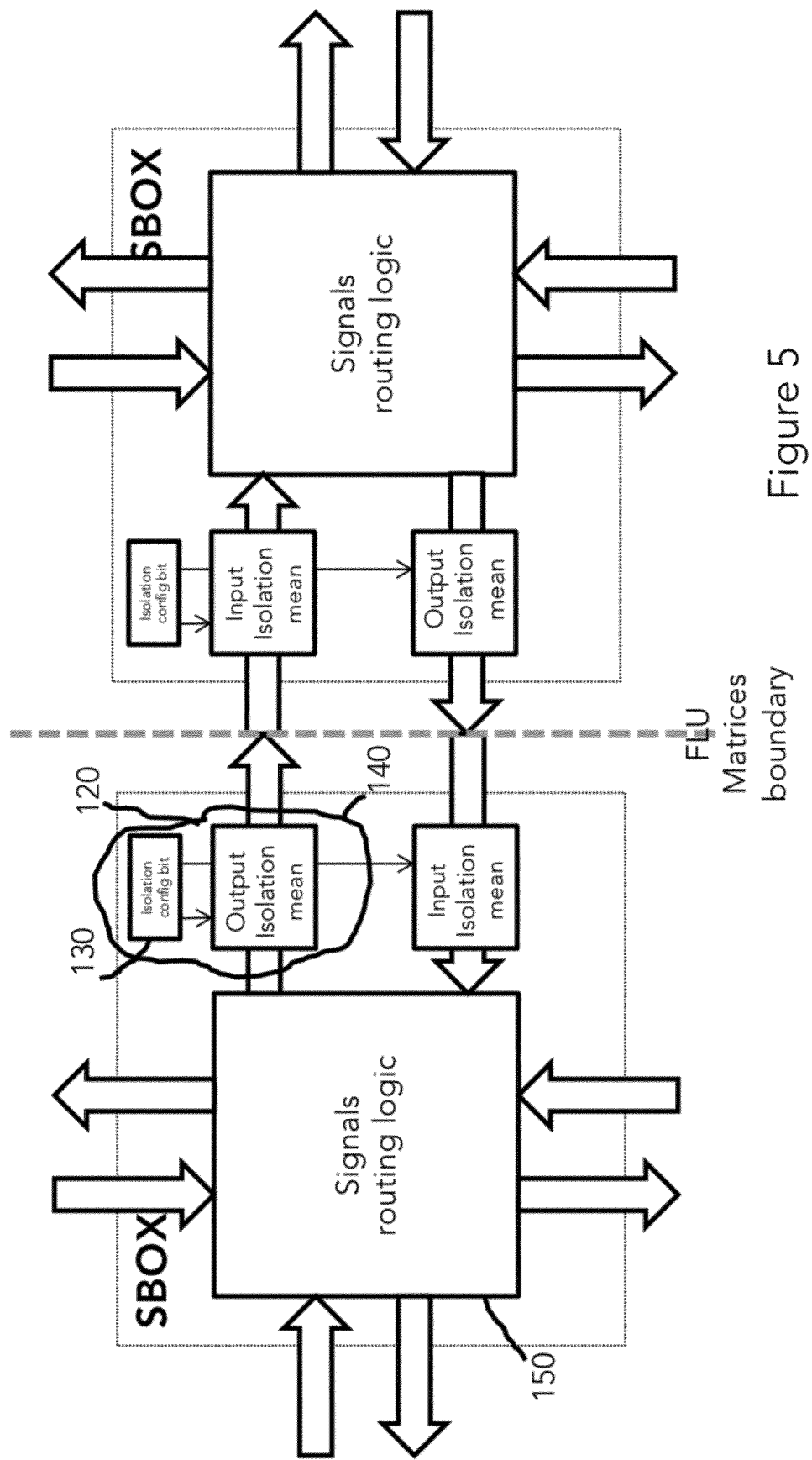
FIG. 5 shows a schematic generalization of these SBOX circuit embodiments, indicating means for physical isolating said output or input, separate from the routing logic, and sharing the isolation (configuration) bit(s) or information and further illustrates how two such SBOX circuits are connected at the boundary of a flexible logic unit (FLU) (matrix) boundary.

It is clear that those special SBOX are then put on the sides of each FLU part that is contiguous with another one and hence are used a FLU partition connection as illustrated in FIG. 5. Therefore, the contiguous FLU parts can be either independent (i.e. isolated) or fully connected through SBOXES. In the latter case, it is possible to consider the contiguous FLU parts as a single one from tooling point of view because the routing resources between the two parts are 100% identical as the ones that can be found at any point of the inner side of each parts (i.e: isolation logic in transparent).

As discussed above the invention provides for specific (electronic) control structures (700) (connectable to control structures of the same kind), comprising: a control system (710) for (capable of) generating instructions or signals (such as clock, reset or context switch signals) for control of a (FLU) (unit) arrangement (500, 510); first control input means (720) for receiving first control signals from a first (external) control system (possibly being part of an other similar (electronic) control structure); second control input means (730) for receiving second control signals (possibly from yet another similar (electronic) control structure); configuration input means (740) for inputting information (configuration bit) representative to whether (neighbouring) arrangement are physically connected or isolated; control logic, capable on the basis of said information, to select either the instructions or signals generated by said control system as output (760) (towards its associated (FLU) (unit) arrangement) or otherwise both pass said first control signals through (750) to said yet another control structure (optionally with delay), use said second control signals as output (towards its associated (FLU) (unit) arrangement) and pass through (770) said second control signals to said other control structure.

Full leverage on the provided system can be taking by use of computer implemented methods of computer assisted designing a (FLU) system (400), comprising: (i) loading a template of such (FLU) system; (ii) determining the amount of computational blocks (410) (configurable logic blocks (CLB's) and/or signal processing units (SPU's), input-output blocks (IOB's)(420) (and connection blocks (CB's) (430)), (iii) determining the amount of each of such blocks to be part of a (FLU) (unit) arrangements (500, 510), (iv) determining the amount of (SBOX) (blocks) circuits (100, 105, 110) for such (FLU) (unit) arrangement; (v) defining connection lines between (SBOX) blocks of neighbouring arrangements; and (vi) automatically generating the defined (FLU) system.

The invented system can support different methods. As said before a single flexible logic unit is defined as such unit that can execute an independent function. The purpose of the invention is to safely (by use of the SBOX functionality) combine such arrangements and thereby being able to define two or more independent functions, defined by one or more flexible logic units arrangement combined together, again each of said functions being independent. The following methods are described with two functions but the invention is not limited thereto.

The invention hence provides a method of operating a (FLU) system as described above, wherein said (FLU) system being configured in that a first one or more of (FLU) (unit) arrangements jointly defines an first independent function while a second one or more such (FLU) (unit) arrangements jointly defines an second independent function (different from said first independent function), the method comprises: independently executing said functions by their associated (combined) arrangements while keeping the connections (via said SBOX circuits) between these associated (combined) arrangements physically isolated. Note that said one or more of these first and second one or more (FLU) (unit) arrangements defining their function operate at a different clock and/or may even be separately powered down.

A typical system wherein the invention can be advantageously used is a heterogeneous hardware system comprising: (i) a plurality of electronic components, each being a software programmable unit, preferably a microprocessor core or a graphics processor core; and (ii) a hardware programmable unit, being a programmable logic matrix, with the segregation functionality as described, whereby a first combined arrangement is connected (via its input-output blocks) to a first electronic component (600); and a second combined arrangement being connected (via its input-output blocks) to a second electronic component (640) (said connection may be direct or indirect via additional (slave) interface circuits (620, 630), preferably one per arrangement).

An alternative system is a heterogeneous hardware system comprising: (i) a plurality of electronic components, each being a (SOC) peripheral hardware unit, optionally dedicated to an electric engine control unit hardware functions; and (ii) a hardware programmable unit, being a programmable logic matrix, with the described functionality, whereby a first combined arrangement is connected (via its input-output blocks) to a first electronic component; and a second combined arrangement being connected (via its input-output blocks) to a second electronic component (said connection may be direct or indirect via one or more additional (master) interface circuits, possibly one per arrangement, optionally (for input to the system) via (direct) multiplexers, preferably one per arrangement).

Another method provides partially reconfiguring of (FLU) system as described, wherein said (FLU) system being configured in that a first one or more of (FLU) (unit) arrangements jointly define an first independent function while a second one or more such (FLU) (unit) arrangements jointly define an second independent function, the method comprises: reconfiguring the first (combined) arrangements while executing said second function by the second (combined) arrangements of which the connections are kept physically isolated from the first (combined) arrangements.

Yet another method of task and/or context switching is provided within a (FLU) system as described, wherein said (FLU) system being configured in that a first one or more of (FLU) (unit) arrangements jointly define an first independent function while a second one or more such (FLU) (unit) arrangements jointly define an second independent function, wherein these first and second one or more (FLU) (unit) arrangement defining their function being adapted for sequentially execution of at least two tasks (or functions), the method comprises: performing task and/or context switching for the first (combined) arrangements while executing said second function by the second (combined) arrangements of which the connections are kept physically isolated from the first (combined) arrangements.

A further method of enhanced safety operating a (FLU) system going in partial failure is disclosed, wherein said (FLU) system being configured in that a plurality of (FLU) (unit) arrangements, connected via said SBOX circuit, are capable of jointly execution a first function, the method comprises: executing said first function while said plurality of (FLU) (unit) arrangement are connected via said SBOX circuit; upon detection of failure in one of said (FLU) (unit) arrangements, terminating said execution; reconfiguring the remaining still operations ones said (FLU) (unit) arrangements and execution the reconfigured operation (a second function) while keeping the connections between the failed and remaining still operations ones said (FLU) (unit) arrangements kept physically isolated.

An alternative use of task and/or context switching within a (FLU) system discussed, wherein said (FLU) system being configured in that a first one or more of (FLU) (unit) arrangements jointly define an first independent entity while a second one or more such (FLU) (unit) arrangements jointly define an second independent entity, whereby the second (combined) arrangements it's connections are kept physically isolated from the first (combined) arrangements, further characterized in that said first and second independent entity have also an independent (an and hence possibly different) task and/or context switching policy.

Also a method of safe operating a (FLU) system is described, wherein said (FLU) system being configured in that a first one or more of (FLU) (unit) arrangements jointly define an first function while a second one or more such (FLU) (unit) arrangements jointly define the same first function (on the same data), the method comprises: performing the first function by the first (combined) arrangements and using the outcome thereof while executing said second function by the second (combined) arrangements of which the connections are kept physically isolated from the first (combined) arrangements; upon detection of failure in said first one or more of said (FLU) (unit) arrangements, selecting the outcome of said second one or more of said (FLU) (unit) arrangements.

FLU Partitions Arrangements

Figure 19:
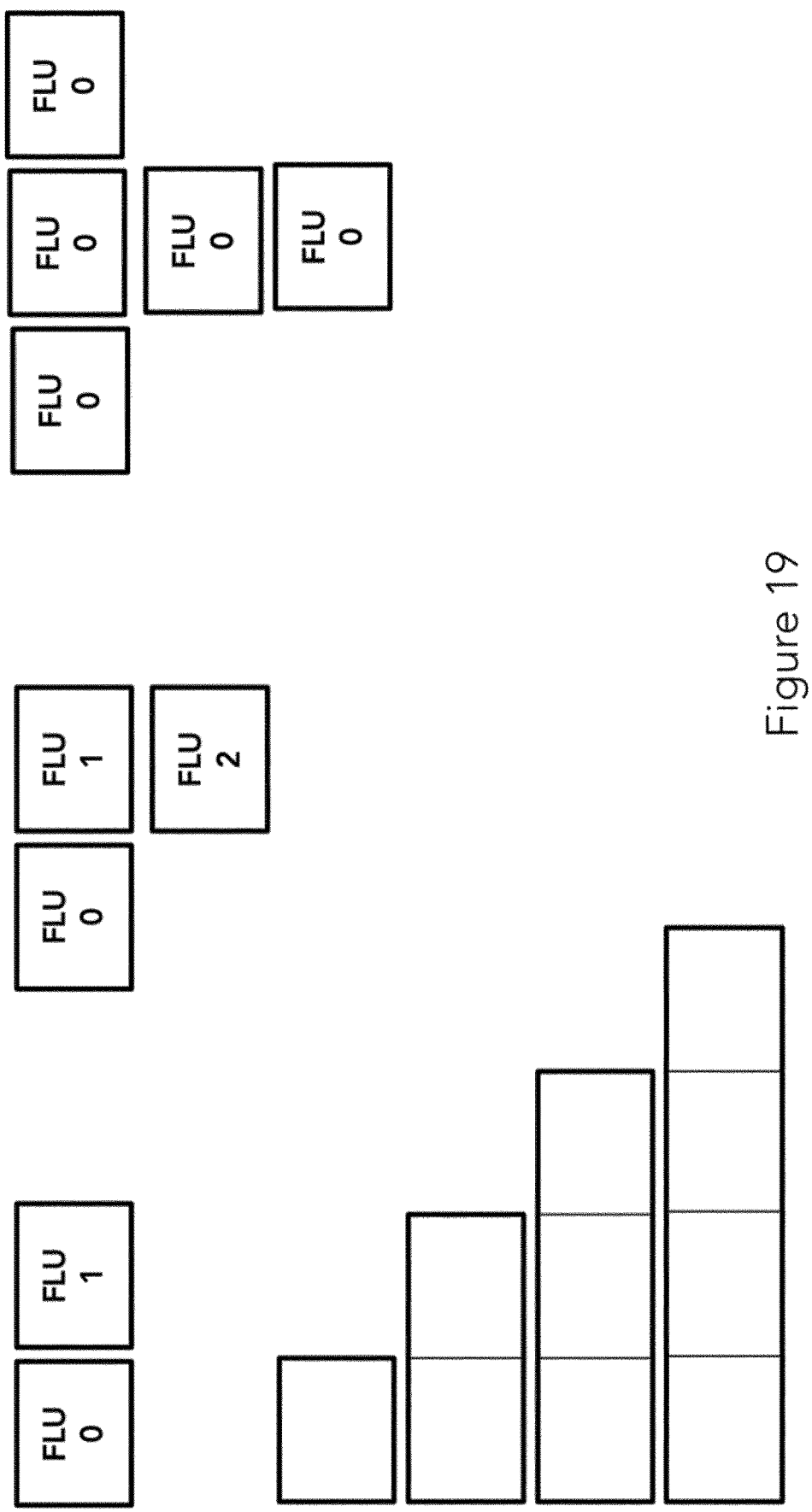
FIG. 19 schematically shows various organization of the FLU (unit) arrangements.

On silicon, the different FLU partitions can be located in whatever side-by-side arrangements are illustrated in FIG. 19. However, because of the column based micro-architecture of the FLU, the most realistic arrangement is the left-right in-line arrangement as shown in FIG. 21 left. Note that the number of partition is not limited.

FLU Tooling Configuration

Once the FLU partitions structure is defined as shown in previous section, we have to make sure that the FLU mapping tools can manage the different FLU arrangement.

The first task is to define all the possible FLU arrangement configurations that can be configured for a given FLU partitions structure:

Example: for our typical structure of 4 FLU partitions, there are four basic arrangements to be considered from FLU tooling point of view as schematically represented by FIG. 19 bottom left.

Each arrangement is associated with a tooling configuration file that describe the matrix resources (this is the normal way of working with eFPGA matrix)

Once the tool configuration files are ready, then the final user can use them as he want in order to fill the FLU partitions as he wishes.

EXAMPLES

If the user has two small applications to map, then he will use the first configuration two times (once for each application). The result will be that FLU partitions 0 and 1 are used and the other ones are left idle.

If the user has one small application and another big one. Then he will use the configuration 1 for the small app, and the $3^{rd}$ one for the big one. The result will be that the FLU partition 0 will run the small application. And the 3 remaining partitions will be merged as a single one to run the big application.

Additional Beneficial Uses Enabled by the Invention

Segregated Clock and Reset

Each FLU controller can be programmed to generate a FLU clock at a user defined rate.

This mechanism applies independently for each FLU partition because each of them has a separate FLU controller. In previous section, we have presented how the FLU controllers of the same FLU groups can synchronize themselves to enable common clock of all the FLU matrices of the group.

Therefore:
All FLU matrices in a group are guaranteed to have the exact same clock signal.
Different groups of FLU matrices can have different clock frequencies.
FLU partition that are not in use can have idle clocks (power consumption optimization)

Segregated Context Switch

If a FLU matrix is capable of context switching, in accordance with the invention, this mechanism applies independently for each FLU partition because each of them has a separate FLU controller. In previous section, we have presented how the FLU controllers of the same FLU groups can synchronize themselves to enable common control of all the FLU matrices of the group.

Therefore:
All FLU matrices in a group have same context switch control.
Different groups of FLU matrices have different context switch scenario.

Example

Let's imagine the FLU grouping (i.e: 3 applications) shown in FIG. 22 left.

In this architecture, we can imagine the following context switching strategies:
Group 0: no context switch
Group 1: fast context switch between two bitstreams (ping-pong mode)
Group 2: Slow context switch between three bitstream Power Consumption Optimization Because the FLU partitions are physically separated in our segregation concept, it is possible to embed them in separate power domains.

It is therefore possible to switch on/off the power of any partition of FLU according to device computing power requirements.

It is also possible to mix context switching, power switching and clock gating to enable fine grain power consumption optimization of the FLU. This is quite similar to what exist for CPU core power states.

Example: Imagine we have two FLU matrix groups and two applications to be executed with relatively low computing power requirements. In this case our architecture permits to execute those applications differently depending on the power characteristics of the silicon technology The top profile of FIG. 24 shall be more beneficial to technology node with high static leakage.

Figure 24:
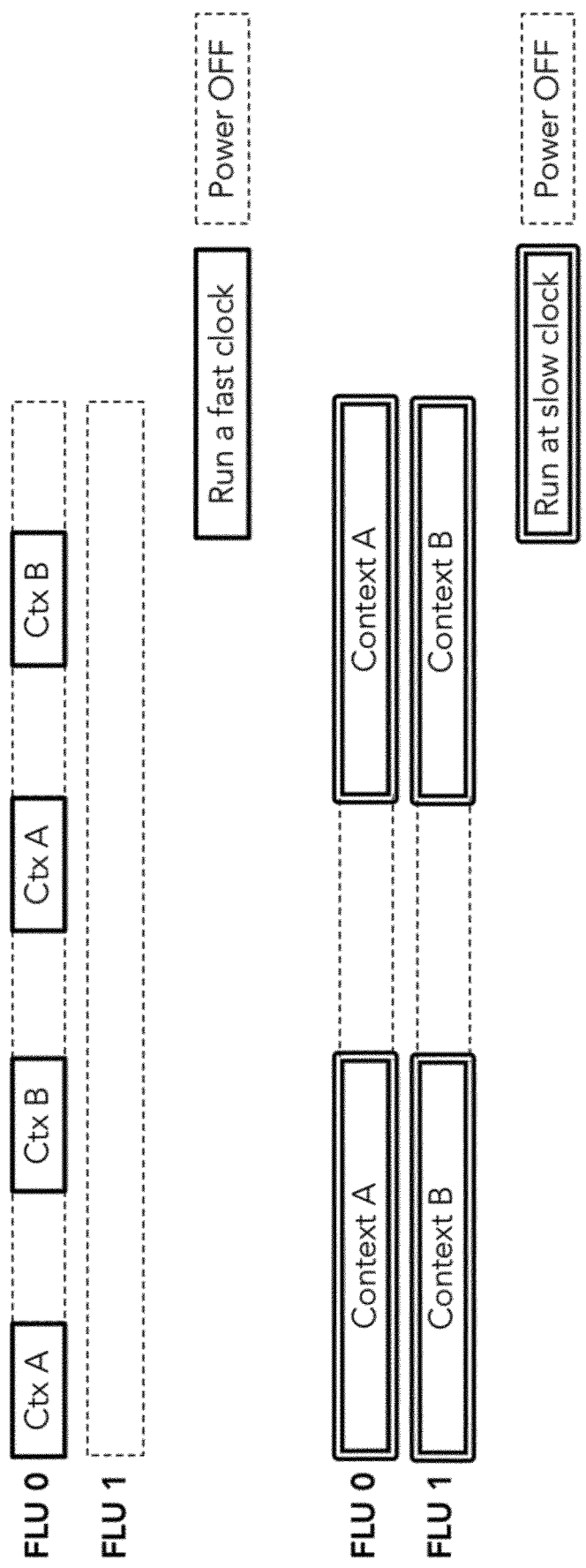
FIG. 24 described some power optimization enabled by the invented concept.

The bottom profile of FIG. 24 shall be more beneficial to technology node with low static leakage.

Safety Related Benefits

Clock Segregation

In terms of functional safety there is a great benefit of having separate clock and reset control per FLU groups. Indeed, in case of failure of a FLU clock generator, only one FLU group is impacted. All other groups continue to work properly.

Fail Operational Scenario

Our FLU matrix embeds multiple mechanism to detect transitory errors at runtime:
Configuration integrity
User flip-flop integrity Also, it is possible to program safety monitoring modules of the FPCU to make sure that FLU is operating properly (like watchdog or event graph checker»)

In case or error detected by any of previous mechanism. The priority action is to stop the failing FLU matrix and put all it outputs in "safe" state.

This strategy is OK for some application but could be dangerous on others.
In case of power train motor control. It is OK: the motor will not be driven anymore and the vehicle will stop eventually slowly.
However, in case of electric steering control this strategy may be fatal. We cannot afford to lose control of the steering.

In the latter case, we need a «fail operational» scenario where a redundant system can be used instead on the failing one.

This can be done thanks to FLU segregation with following usage:
Let's have two FLU groups
Let's program both groups with exact same bitstream.
Let's manage to have both groups receiving the exact same input data
Except one input that specifies the effective "active" group. This information should come from the fault manager of the FPCU. This one shall be programmed to activate one group at reset and automatically switch to the other one is case where an error is detected on first FLU group.

At runtime both groups are started in parallel. So they are both operating the same way cycle-by-cycle.

Figure 23:
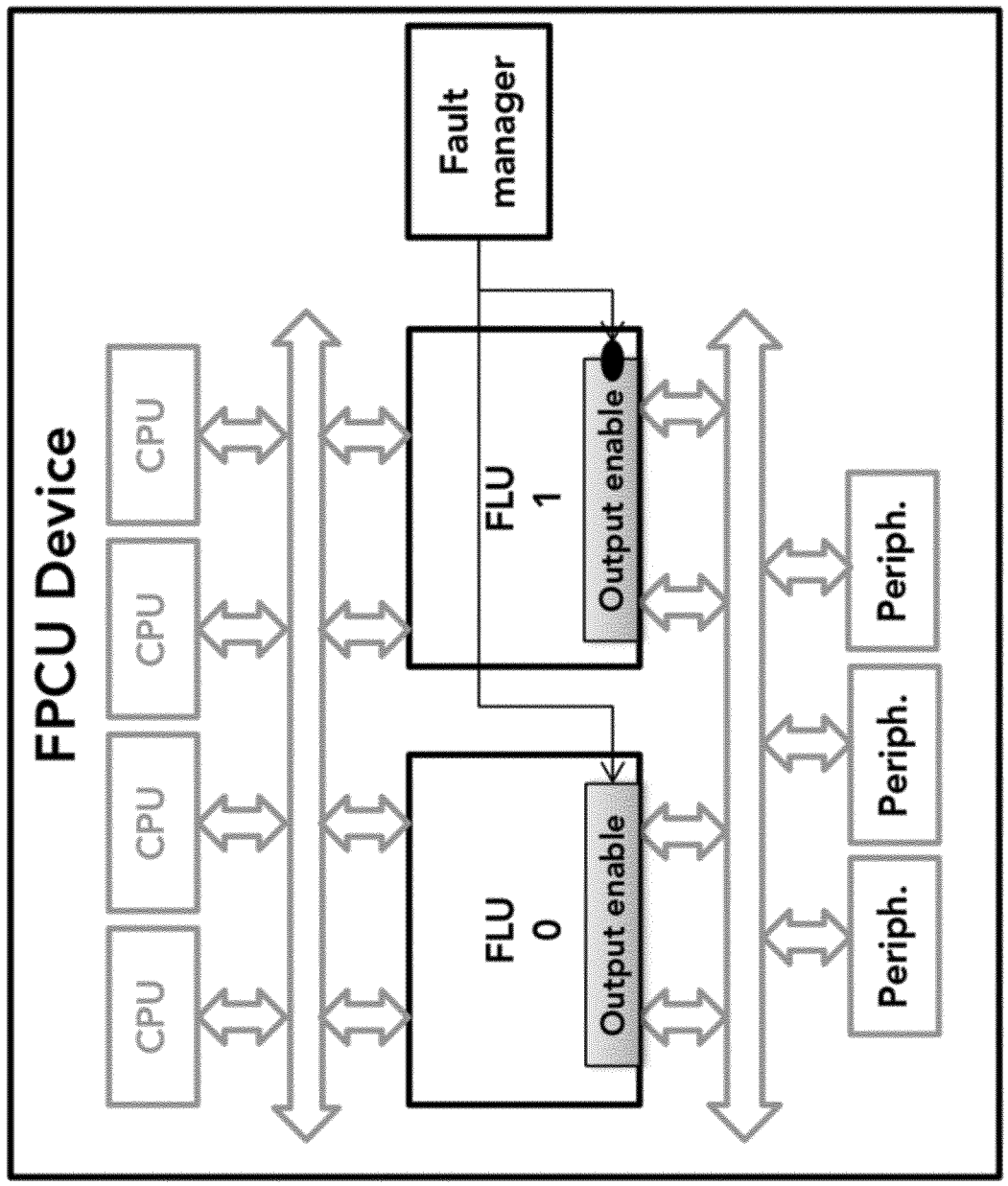
FIG. 23 shows an additional advantageous embodiment of the invention contributing to a safe operating a (FLU) system (segregated in accordance with the invention) wherein a fault manager upon detection of failure in one or more of said (FLU) (unit) arrangements, selects the outcome of the proper operating one or more of said (FLU) (unit) arrangements.

Therefore, when the fault manager switches from one to the other group, the transition is done with no impact at system level. This is illustrated in FIG. 23.

The invention claimed is:

1. A system comprising:
    a plurality of flexible logic unit arrangements, each flexible logic unit arrangement comprising a plurality of computational blocks arranged in an array, the flexible logic unit arrangements being arranged side-by-side and adapted for being pair-wise either physically connected or isolated; and
    a plurality of electronic control structures,
wherein:
    each electronic control structure is uniquely associated to one of the flexible logic unit arrangements;
    the electronic control structures are adapted for being pair-wise physically connected or disconnected in alignment with the connection or isolation of their respective arrangement; and
    the electronic control structure comprises a control system for generating control signals for control of a flexible logic unit arrangement.

2. The system of claim 1, wherein the electronic control structures further comprise:
    first control signal input means for receiving first control signals from a first control system;
    second control input means for receiving second control signals;
    configuration input means for inputting information representative to whether flexible logic unit arrangements are physically connected or isolated; and
    control logic that is capable on the basis of the information to select either control signals generated by the control system as output toward its associated flexible logic unit arrangement or otherwise both pass the first control signals through to the yet another control structure, use the second control signals as output toward its associated flexible logic unit arrangement, and pass through the second control signals to the other control structure.

3. The system of claim 2, wherein the control logic of the electronic control structure comprises two selectors controlled by the information.

4. The system of claim 2, wherein control logic of the electronic control structure comprises a storage means in a pass through path.

5. The system of claim 2, further comprising a plurality of circuits that are part of internal routing logic within the flexible logic unit arrangements and are indirectly or directly connectable with each other when belonging to another flexible logic unit arrangement.

6. The system of claim 1, wherein:
    each flexible logic unit arrangements further comprises:
        a plurality of input-output blocks provided at boundaries of the flexible logic unit arrangement; and
        a plurality of circuits provided at boundaries of the flexible logic unit arrangements,
    the circuits of the flexible logic unit arrangements are connectable to the computational blocks of the same flexible logic unit arrangement and to the input-output blocks of the same flexible logic unit arrangement; and the circuits of the flexible logic unit arrangements are indirectly connectable with each other within the same flexible logic unit arrangement or directly connectable when belonging to another flexible logic unit arrangement.

7. The system of claim 6, access to either the inputs and/or output(s) of the circuits of the flexible logic unit arrangements are physically isolatable at one or multiple sides.

8. The system of claim 7, wherein circuits belonging to a different flexible logic unit arrangement are connected directly only via at least one of the physically isolatable inputs or output(s) of the circuits.

9. The system of claim 6, wherein a plurality of the circuits have at least three input-output sides.

10. The system of claim 6, wherein the plurality of input-output blocks have two input-output sides.

11. The system of claim 1, wherein the electronic control structures are connectable to other electronic control structures of the same kind.

12. A method of operating the system of claim 1, wherein the system is configured in that two or more independent functions are defined by one or more combined flexible logic unit arrangements, each of the functions being independent, the method comprising:
  independently executing the functions by their associated combined flexible logic unit arrangements while keeping connections between the associated combined flexible logic unit arrangements physically isolated.

13. The method of claim 12, wherein the combined flexible logic unit arrangements defining their function operate at a different clock and/or may be separately powered down.

14. The method of claim 12, wherein the system is a heterogeneous hardware system comprising:
  (i) a plurality of electronic components, each being a software programmable unit, a microprocessor core or a graphics processor core, or a peripheral hardware unit, optionally dedicated to hardware functions of an electric engine control unit; and
  (ii) a hardware programmable unit, being a programmable logic matrix, whereby the combined flexible logic unit arrangement is connected directly via input—output blocks to an associated electronic component or is connected indirectly via additional interface circuits to an associated electronic component.

15. A method of partially reconfiguring the system of claim 1, wherein the system is configured such that two or more independent functions are defined by one or more combined flexible logic unit arrangements, each of the functions being independent, the method comprising:
  reconfiguring one or more of the combined flexible logic unit arrangements while continuing executing functions by the other combined flexible logic unit arrangements of which the connections are kept physically isolated from the flexible logic unit arrangements being reconfigured.

16. A method of task and/or context switching within the system of claim 1, wherein the system is configured such that two or more independent functions are defined by one or more combined flexible logic unit arrangements, each of the functions being independent, wherein the combined flexible logic unit arrangements defining their function are adapted for sequential execution of at least two tasks or functions, the method comprising:
  performing task and/or context switching by one or more of the combined flexible logic unit arrangements while continuing execution of functions by other combined flexible logic unit arrangements with connections that are kept physically isolated from the combined flexible logic unit arrangements by which the task and/or context switching is performed.

17. A method of enhanced safely operating a system according to claim 1 that is going in partial failure, wherein the system is configured such that a plurality of flexible logic unit arrangements, connected via a circuit, are capable of jointly executing a first function, the method comprising:
  executing the first function while the plurality of the flexible logic unit arrangements are connected via the circuit;
  upon detection of failure in one of the flexible logic unit arrangements, terminating the execution;
  reconfiguring flexible logic unit arrangements that are still operating and executing a reconfigured operation while keeping the connections between failed flexible logic units and the flexible logic units that are still operating physically isolated.

18. A method of safely operating the system of claim 1, wherein the system is configured such that a first one or more of the flexible logic unit arrangements jointly define a first function while a second one or more flexible logic unit arrangements jointly define the same first function on the same data, the method comprising:
  performing the first function by the first one or more of the flexible logic unit arrangements and using the outcome thereof while executing the second function by the second one or more of the flexible logic unit arrangements while connections of the second one or more of the flexible logic unit arrangements are kept physically isolated from the first one or more of the flexible logic unit arrangements;
  upon detection of failure in the first one or more of the flexible logic unit arrangements, selecting an outcome of the second one or more of the flexible logic unit arrangements.

* * * * *